(12) United States Patent
Chang et al.

(10) Patent No.: US 10,381,755 B2
(45) Date of Patent: Aug. 13, 2019

(54) ELECTRICAL CONNECTOR TO AVOID MISSING SOLDER

(71) Applicant: LOTES CO., LTD, Keelung (TW)

(72) Inventors: Wen Chang Chang, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/860,839

(22) Filed: Jan. 3, 2018

(65) Prior Publication Data

US 2018/0212347 A1 Jul. 26, 2018

(30) Foreign Application Priority Data

Jan. 20, 2017 (CN) ...................... 2017 2 0072288 U

(51) Int. Cl.
| | |
|---|---|
| *H01R 12/00* | (2006.01) |
| *H01R 12/57* | (2011.01) |
| *H01R 12/72* | (2011.01) |
| *H05K 3/34* | (2006.01) |
| *H01R 4/02* | (2006.01) |
| *H01R 13/518* | (2006.01) |
| *H01R 12/71* | (2011.01) |
| *H01R 43/02* | (2006.01) |

(52) U.S. Cl.
CPC ............... *H01R 12/57* (2013.01); *H01R 4/02* (2013.01); *H01R 12/716* (2013.01); *H01R 12/721* (2013.01); *H01R 13/518* (2013.01); *H01R 43/0221* (2013.01); *H05K 3/3436* (2013.01); *H01R 12/725* (2013.01)

(58) Field of Classification Search
CPC .... H01R 23/722; H01R 12/57; H01R 13/193; H01R 13/2442; H05K 7/1084; H05K 7/1069; H05K 7/1023
USPC .......................... 439/66, 70–72, 83, 342, 862
See application file for complete search history.

(56) References Cited

U.S. PATENT DOCUMENTS

| | | | |
|---|---|---|---|
| 5,148,962 A | * | 9/1992 | Jones ................... B23K 1/0056 228/49.1 |
| 6,139,336 A | | 10/2000 | Olson |
| | | (Continued) | |

FOREIGN PATENT DOCUMENTS

| | | |
|---|---|---|
| CN | 201838745 U | 5/2011 |
| CN | 103036075 A | 4/2013 |
| | (Continued) | |

*Primary Examiner* — Thanh Tam T Le
(74) *Attorney, Agent, or Firm* — Locke Lord LLP; Tim Tingkang Xia, Esq.

(57) ABSTRACT

An electrical connector is used for electrically connecting a chip module to a circuit board. The electrical connector includes an insulating body having multiple receiving holes and multiple terminals received in the receiving holes The electrical connector has a top surface and a bottom surface The receiving holes run through the insulating body. Each terminal has a base and a soldering portion extending from a lower part thereof. Two opposite sides of the soldering portion are a first surface and a second surface. The first surface includes a laser irradiation area. A solder is provided at a position, opposite to the laser irradiation area, of the second surface for urging. The laser irradiation area is heated by external laser, such that the solder is partially melted and is soldered and fixed to the second surface.

24 Claims, 24 Drawing Sheets

(56) References Cited

U.S. PATENT DOCUMENTS

| | | | | |
|---|---|---|---|---|
| 6,585,527 B2* | 7/2003 | Koopman | H01R 13/2435 | |
| | | | 439/66 | |
| 7,458,828 B2* | 12/2008 | Pavlovic | H01R 13/41 | |
| | | | 439/70 | |
| 7,896,680 B2* | 3/2011 | Szu | H01R 13/193 | |
| | | | 439/342 | |
| 8,235,733 B2* | 8/2012 | Yamashiro | H01R 12/57 | |
| | | | 439/74 | |
| 8,366,453 B2* | 2/2013 | Chang | H01R 12/58 | |
| | | | 439/66 | |
| 8,430,682 B2* | 4/2013 | Liao | H01R 12/57 | |
| | | | 439/342 | |
| 8,550,825 B2* | 10/2013 | Mason | G01R 1/0466 | |
| | | | 439/66 | |
| 8,911,242 B2* | 12/2014 | Jeon | H01R 13/2442 | |
| | | | 439/66 | |
| 9,039,425 B2* | 5/2015 | Mason | H01R 13/6581 | |
| | | | 439/66 | |
| 9,088,084 B2* | 7/2015 | Liao | H01R 13/41 | |

FOREIGN PATENT DOCUMENTS

| | | |
|---|---|---|
| CN | 104701654 A | 6/2015 |
| TW | M250422 U | 11/2004 |

* cited by examiner

ELECTRICAL CONNECTOR TO AVOID MISSING SOLDER

CROSS-REFERENCE TO RELATED APPLICATION

This non-provisional application claims priority to and benefit of, under 35 U.S.C. § 119(a), Patent Application No. 201720072288.2 filed in P.R. China on Jan. 20, 2017, the entire content of which is hereby incorporated by reference.

FIELD OF THE INVENTION

The present invention relates to an electrical connector, and more particularly to an electrical connector that electrically connects a chip module to a circuit board.

BACKGROUND OF THE INVENTION

Chinese Patent Application No. CN201210359807.5 discloses an electrical connector. The electrical connector includes a housing and an electrical terminal mounted on the housing. The electrical connector is surface mounted on a circuit substrate. The electrical terminal has a substrate connecting portion soldered to the circuit substrate. The substrate connecting portion is formed in a rectangular plate shape extending in a length direction and a width direction, and has a surface opposite to the circuit substrate. A solder structural body is disposed on the surface, and the solder structural body is soldered with the circuit substrate by means of melting energy such as laser. However, energy and time are consumed to completely melt solders, and moreover, the heights of the solders are not in the same plane due to inconsistent solidification shape of the solders, thereby causing bad situations of missing solder and the like during soldering of an electrical connector and a circuit board.

In view of the above problems, Chinese Patent Application No. CN201510093963.5) discloses an electrical connector used for electrically connecting a chip module to a circuit board. The electrical connector includes an insulating body, multiple terminals, and multiple solders. The insulating body is provided with multiple receiving slots running through the insulating body, and the insulating body has a resisting portion. The terminals are respectively located in the receiving slots. Each terminal has a soldering portion disposed at one end thereof. The soldering portion has a soldering surface, and the soldering surface is perpendicular to the surface of the circuit board. Left and right sides of the solders respectively urge against the soldering surface and the resisting portion, and laser soldering is performed on a contact area between the solder and the soldering surface. On the basis of the electrical connector disclosed in the Chinese patent CN201210359807.5, the electrical connector is technically improved, energy and time are saved by partially melting the solders, and the problem that the solders are not in the same plane is partially solved. However, the contact area is over-narrow and over-small, laser soldering is within a controllable precision range, but a laser beam will still deviate from the contact area, irradiate other parts of solder balls, or deviate from the solder balls, causing irregular shaped solder balls, inconsistent heights of the solder balls, or missing solder, thereby influencing soldering of the electrical connector and the circuit board.

Therefore, a heretofore unaddressed need exists in the art to address the aforementioned deficiencies and inadequacies.

SUMMARY OF THE INVENTION

In one aspect, the present invention relates to a new electrical connector that is capable of solving the problems of subsequent missing solder caused by inconsistent shape and size of solders during soldering of the solders and terminals and energy and time consumption of an entire soldering process.

In certain embodiments, an electrical connector includes an insulating body and multiple terminals. The insulating body has a top surface and a bottom surface. Multiple receiving holes run through the insulating body up and down. The terminals are respectively received in the receiving holes. Each terminal has a base and a soldering portion extending from a lower portion of the base. A first surface and a second surface are respectively provided at two opposite sides of the soldering portion. The first surface includes a laser irradiation area. A solder is provided at a position, opposite to the laser irradiation area, of the second surface for urging. The laser irradiation area is heated by external laser, such that the solder in contact with the second surface is partially melted and is further soldered and fixed to the second surface.

In certain embodiments, an elastic arm is formed by bending and extending up from the base and comes into electrical contact with a chip module. A horizontal projection of the elastic arm is partially overlapped or non-overlapped with a horizontal projection of the laser irradiation area, and the horizontal projection of the laser irradiation area is exposed in the receiving hole.

In certain embodiments, an elastic arm is formed by bending and extending up from one side of an upper edge of the base and comes into electrical contact with a chip module, and a strip connecting portion is formed by extending up vertically from the other side of the upper edge of the base and is used for connecting a strip. The strip connecting portion is received in a receiving slot correspondingly provided in the insulating body. The strip connecting portion is torn to form a barb, and the barb extends from the upper edge of the base to the center of the strip connecting portion.

In certain embodiments, an elastic arm is formed by bending and extending up from one side of an upper edge of the base and comes into electrical contact with a chip module, and a strip connecting portion is formed by extending up vertically from the other side of the upper edge of the base and is used for connecting a strip. The strip connecting portion is received in a receiving slot correspondingly provided in the insulating body. An outer side edge of the strip connecting portion is torn to form a barb, and a fillet protruding, close to a position above the barb, from the strip connecting portion is fastened in the receiving slot.

In certain embodiments, the soldering portion bends in a horizontal direction, and the first surface faces the top surface.

In certain embodiments, a positioning portion extends down vertically from the base, and engages with the receiving hole to position the terminal, and the height of a lower edge of the positioning portion is between the second surface and a lowest point of the solder.

In certain embodiments, there are two positioning portions located at two sides of the soldering portion respectively, a pair of grooves is recessed in the outer sides of the two positioning portions symmetrically, and stopping portions are disposed in the receiving holes of the insulating body in correspondence to the grooves.

In certain embodiments, the soldering portion comprises a holding portion which extends to two sides and holds the solder, the solder is spherical, and the soldering portion bends in a circular arc shape adaptive to the solder.

In certain embodiments, a through hole runs through the laser irradiation area, and the solder urges the through hole.

In certain embodiments, the through hole is round, and external laser completely or partially irradiates the solder through the through hole.

In certain embodiments, at least one extending arm is provided between the base and the soldering portion.

In certain embodiments, there are two extending arms, the extending arms, the base and the soldering portion co-encircling a through slot.

In certain embodiments, the extending arms extend down vertically, such that the base and the soldering portion are located in the same plane.

In certain embodiments, a chamfer is recessed in each of two sides of the lower edge of the soldering portion, and a stopping portion is disposed in the receiving hole of the insulating body and stopped below the chamfer.

In certain embodiments, the through slot protrudes downward into the soldering portion, such that a recessed portion is formed in the center of the upper part of the soldering portion, and the solder urges the recessed portion.

In certain embodiments, the extending arm bends and extends downward, the base and the soldering portion are close to planes where two opposite sides of the receiving hole are located, respectively, and the soldering portion is exposed out of the receiving hole.

In certain embodiments, the soldering portion has a protruding portion which protrudes into the through slot, and the solder urges the protruding portion.

In certain embodiments, a notch is provided in an outer side edge of the extending arm, a stopping portion is disposed in the receiving hole of the insulating body and stopped in the notch, and a lower edge of the notch is fastened on the bottom surface in a hook shape.

In certain embodiments, a stopping block is disposed at the lower part of the receiving hole of the insulating body and stopped above the solder, the stopping block and the base are located at the same side of the receiving hole, a protruding block protrudes from the bottom surface of the insulating body, and the protruding block is located at the edge of the receiving hole and opposite to the soldering portion.

In certain embodiments, the solder urges the through slot, and the soldering portion, the extending arm, the protruding block and the stopping block co-retain the solder.

In certain embodiments, external laser completely or partially irradiates the solder through the through slot.

In certain embodiments, a laser incidence slot is provided at a part, close to the laser irradiation area, of the bottom of the insulating body, the laser incidence slot communicates with the receiving hole, and external laser irradiates the laser irradiation area through the laser incidence slot.

In certain embodiments, the solder is a solder ball, a part, urging the second surface, of the solder ball is melted, and the other part is kept in a circular arc shape, and the electrical connector is soldered on a circuit board through the surface of the solder.

In certain embodiments, the solder is a solder ball, and the size of the melted part of the solder ball is ⅖ of the total size of the solder ball.

Compared with the related art, certain embodiments of the present invention have the following beneficial advantages:

In the electrical connector according to certain embodiments of the present invention, the terminals and the solders are soldered by external laser, and the external laser irradiates the laser irradiation area to heat the soldering portion, such that the solder in contact with the second surface is partially melted. The melted part is controllable accurately, such that the solders keep relatively consistent in shape and size, thereby guaranteeing the quality of subsequent soldering between the electrical connector and the circuit board; and the through hole is provided, thereby heating the solder artificially, controllably and directly by energy, shortening the soldering period, reducing the energy consumption, and saving the cost, the through hole being a punch line of the present invention.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
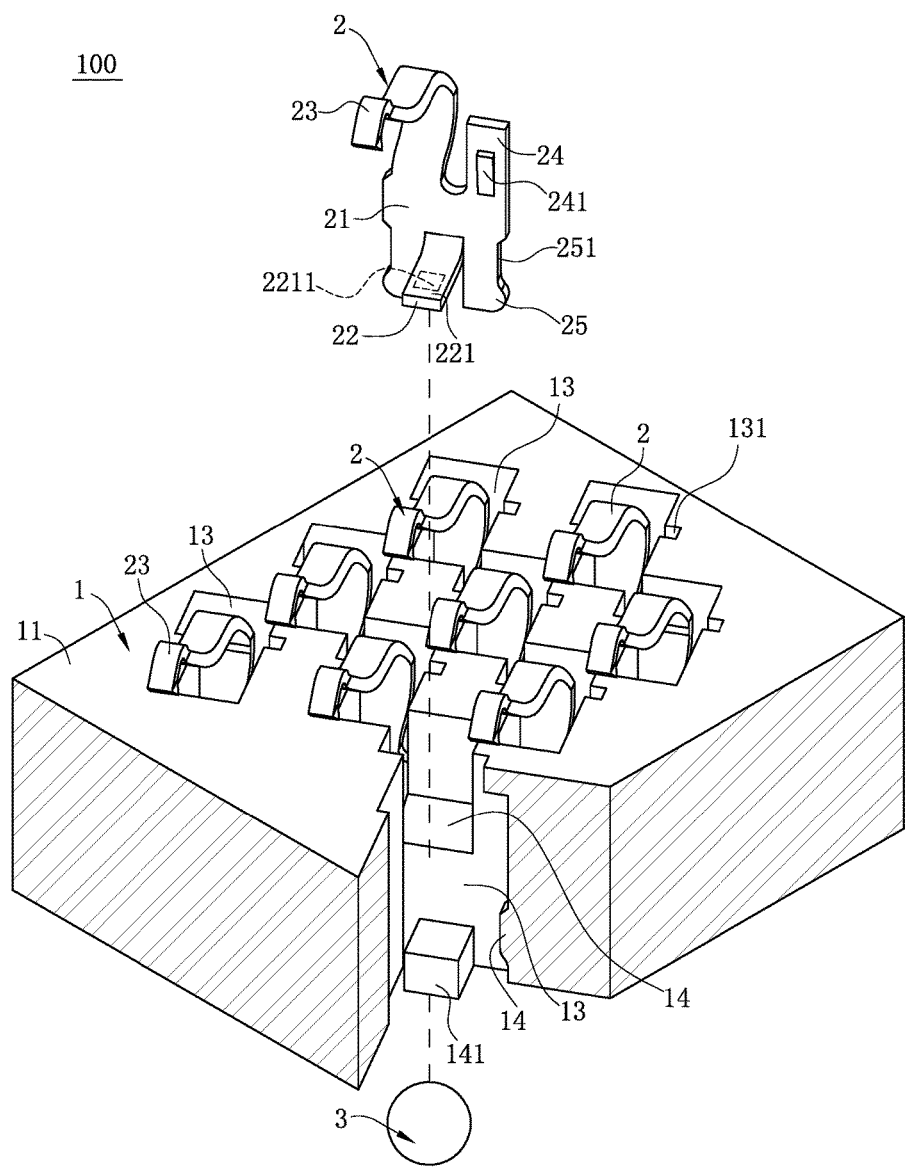
FIG. 1 is a schematic three-dimensional partial exploded view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-24. In accordance with the purposes of this invention, as embodied and broadly described herein, this invention, in one aspect, relates to an electrical connector.

Figure 2:
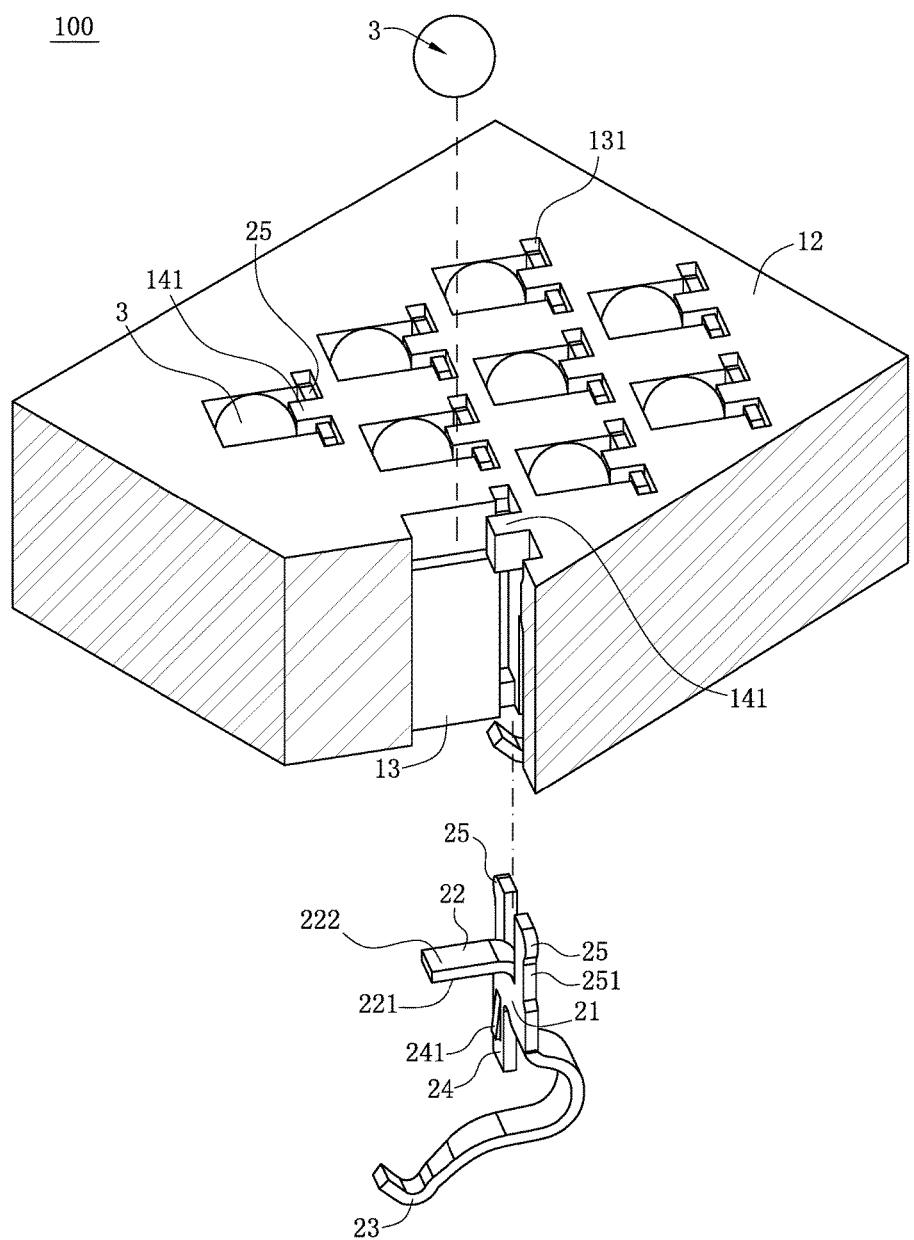
FIG. 2 is a schematic three-dimensional partial exploded view of the electrical connector according to the first embodiment of the present invention viewed from another view angle.
Figure 3:
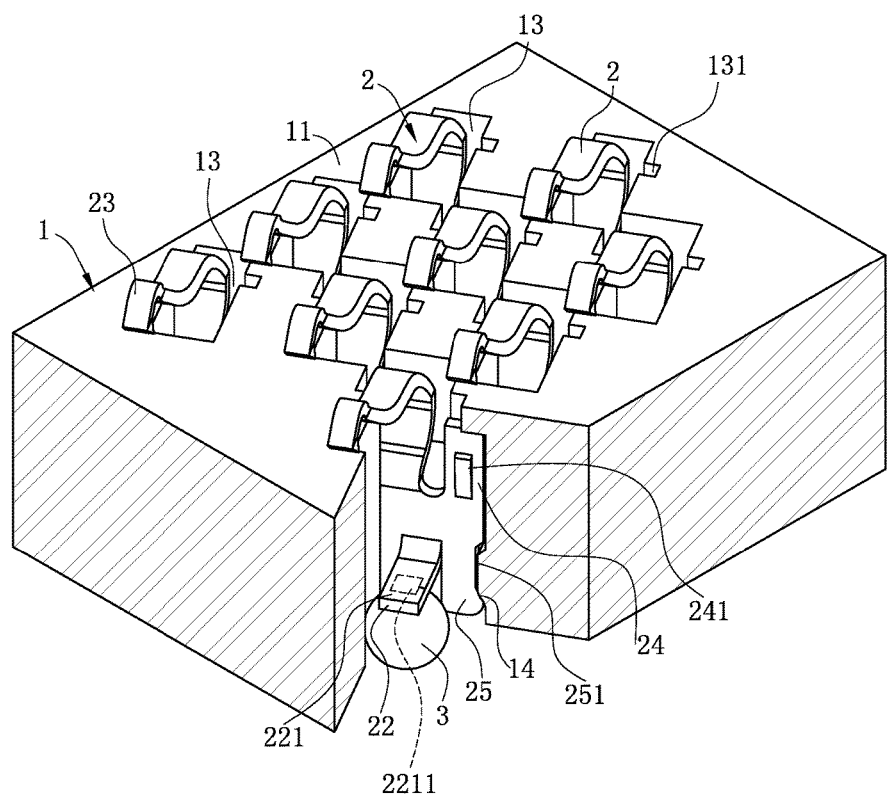
FIG. 3 is a schematic three-dimensional partial assembly view of the electrical connector according to the first embodiment of the present invention.
Figure 4:
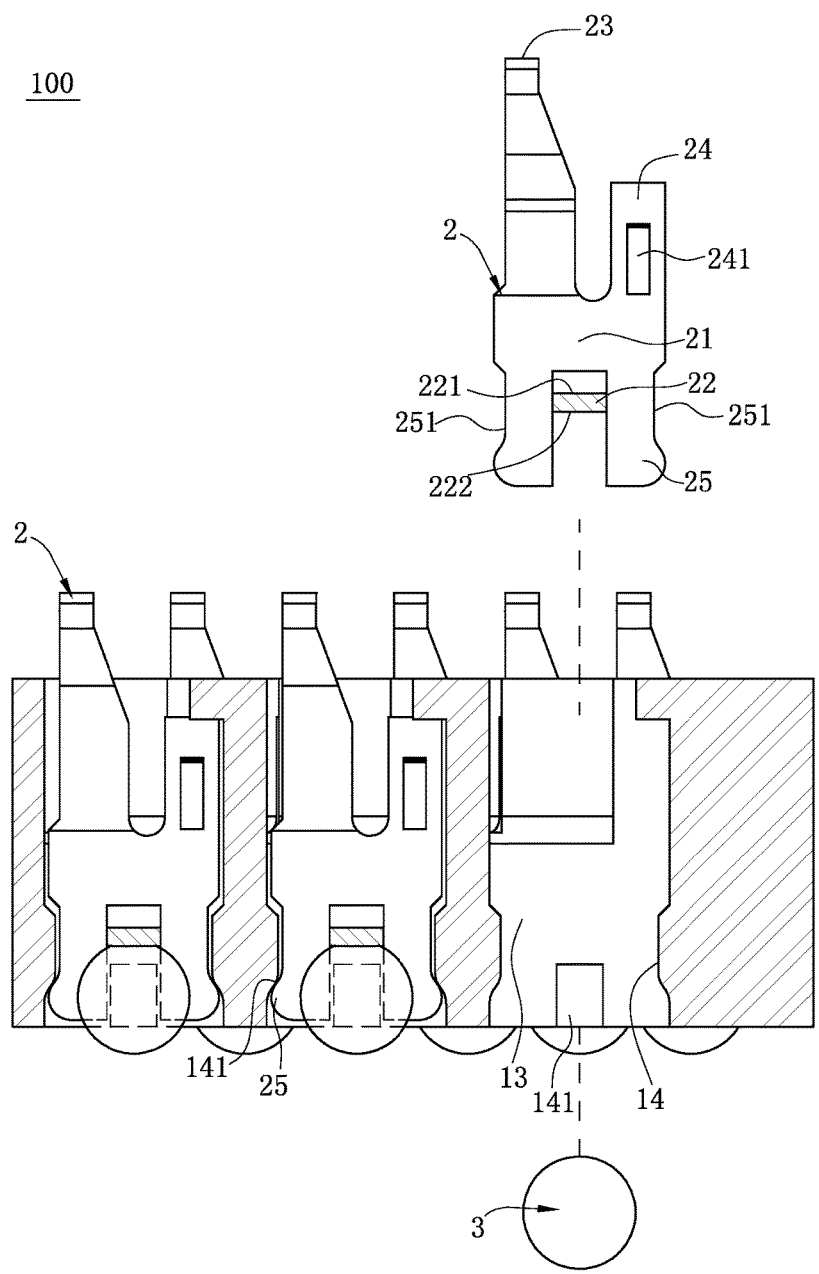
FIG. 4 is a sectional view of the electrical connector according to the first embodiment of the present invention.
Figure 5:
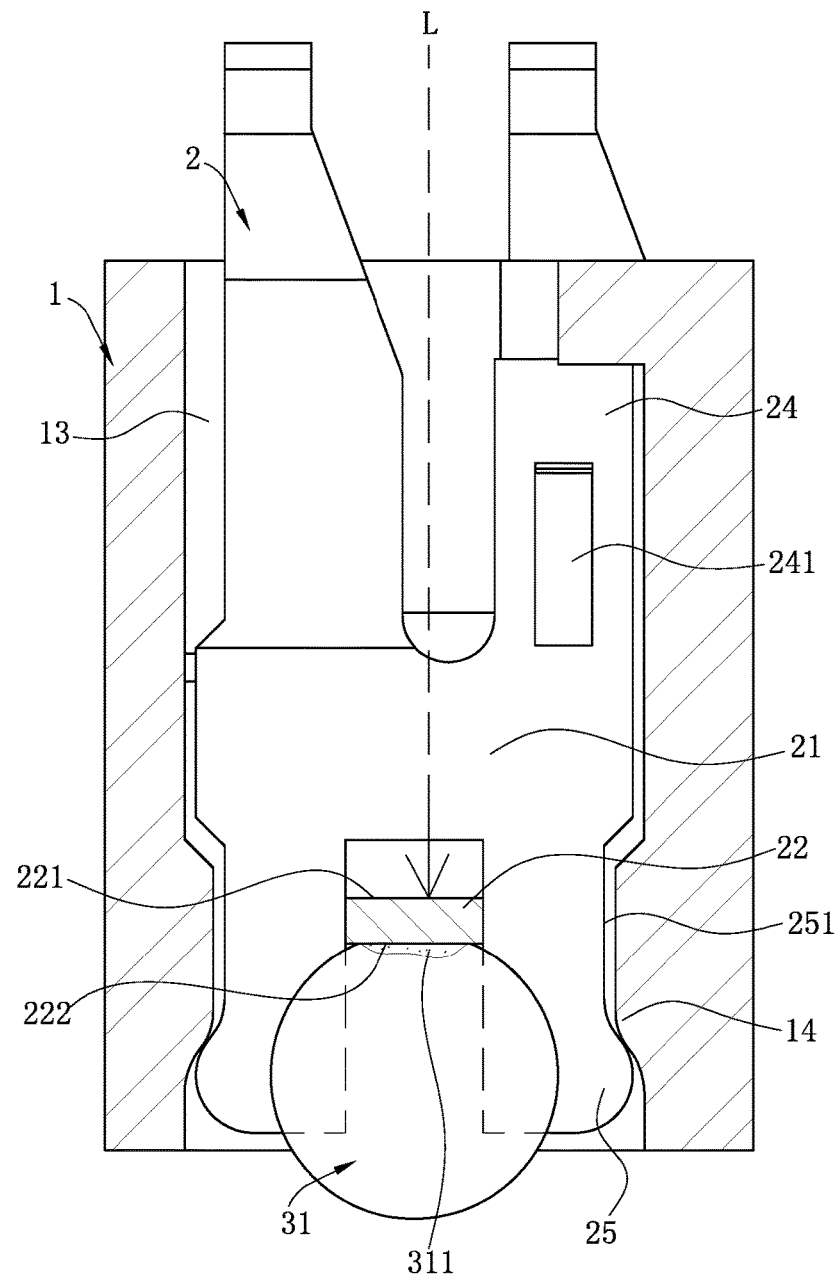
FIG. 5 is a local sectional view of the electrical connector according to the first embodiment of the present invention showing laser soldering.
Figure 6:
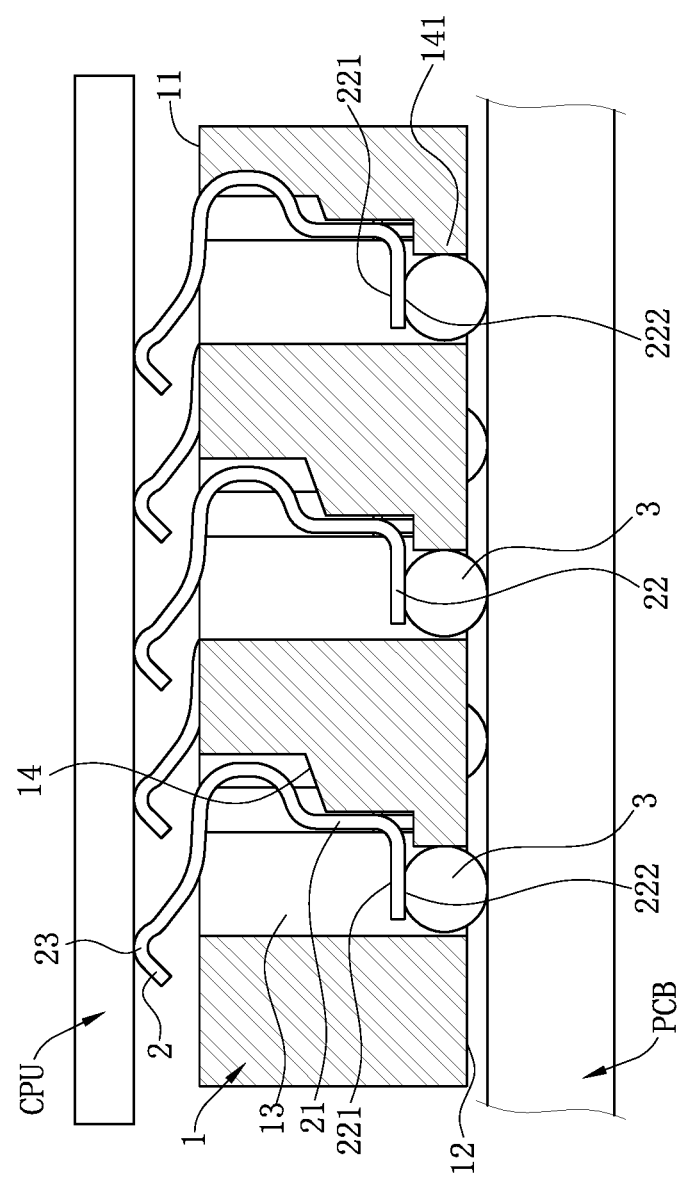
FIG. 6 is a sectional view of the electrical connector according to the first embodiment of the present invention after mounting a chip module and a circuit board.

FIGS. 1-6 show an electrical connector 100 according to a first embodiment of the present invention. As shown in FIGS. 1, 3 and 6, the electrical connector 100 includes an insulating body 1 and multiple terminals 2. The insulating body 1 has a top surface 11 and a bottom surface 12, and multiple receiving holes 13 running through the insulating body 1 up and down. The terminals 2 are respectively received in the receiving holes 13. Each terminal 2 has a base 21 disposed at one side thereof that is close to the receiving hole 13. An elastic arm 23 is formed by bending and extending up from one side of an upper edge of the base 21 and comes into electrical contact with a chip module (central processing unit, CPU). A strip connecting portion 24 extends up from the other side of the upper edge of the base 21 and is retained in a receiving slot 131 correspondingly provided in the insulating body 1, and the terminal 2 is soldered to a circuit board (printed circuit board, PCB) via a solder 3.

As shown in FIGS. 1, 2 and 4, a soldering portion 22 bends and extends from a lower part of the base 21 in a horizontal direction. A first surface 221 and a second surface 222 are provided at two opposite sides of the soldering portion 22. The first surface 221 faces the top surface 11. The first surface 221 includes a laser irradiation area 2211 (as shown in dotted lines in the figure, similarly hereinafter). A solder 3 is provided at a position, opposite to the laser irradiation area 2211, of the second surface 222 for urging. The elastic arm 23 extends toward the upper rear of the base 21 firstly (the extending direction of the soldering portion 22 is defined as toward the front of the base 21 herein), then returns to extend toward the front of the base 21 in a direction substantially parallel to the soldering portion 22. A horizontal projection of the elastic arm and a horizontal projection of the soldering portion are at least partially not overlapped. The upper rear extending section of the elastic arm 23 urges above a stopping portion 14 of the insulating body 1 that is disposed in the receiving hole 13. A strip connecting portion 24 extends up from the other side of the upper edge of the base 21 and is received in the insulating body 1. The center of the strip connecting portion 24 is torn to form a barb 241. Two positioning portions 25 extend down vertically from two sides of the soldering portion 22 of the base 21. The positioning portions 25 are received in the receiving slot 131, and the height of the lower edge of the positioning portions 25 is between the second surface 222 and a lowest point of the solder 3. A pair of grooves 251 is recessed in the outer sides of the positioning portion 25 symmetrically. The terminal 2 is received in the receiving hole 13. The grooves 251 respectively clamp the stopping portions 14 correspondingly provided in the insulating body 1. A stopping block 141 is disposed at a side, having the base 21, in the receiving hole 13 of the insulating body 1 and stopped on a side of the solder 3. The stopping block 141 penetrates between the two positioning portions 25, and the lower edge of the stopping block 141 is flush with the bottom surface 12.

As shown in FIG. 5, the horizontal projection of the elastic arm 23 is partially overlapped or not overlapped with a horizontal projection of the laser irradiation area 2211, and the horizontal projection of the laser irradiation area 2211 is exposed in the receiving hole 13. External laser L heats the laser irradiation area 2211 through the receiving hole 13, energy is conducted to the solder 3, and the solder 3 is partially melted and is further soldered and fixed to the second surface 222.

Figure 7:
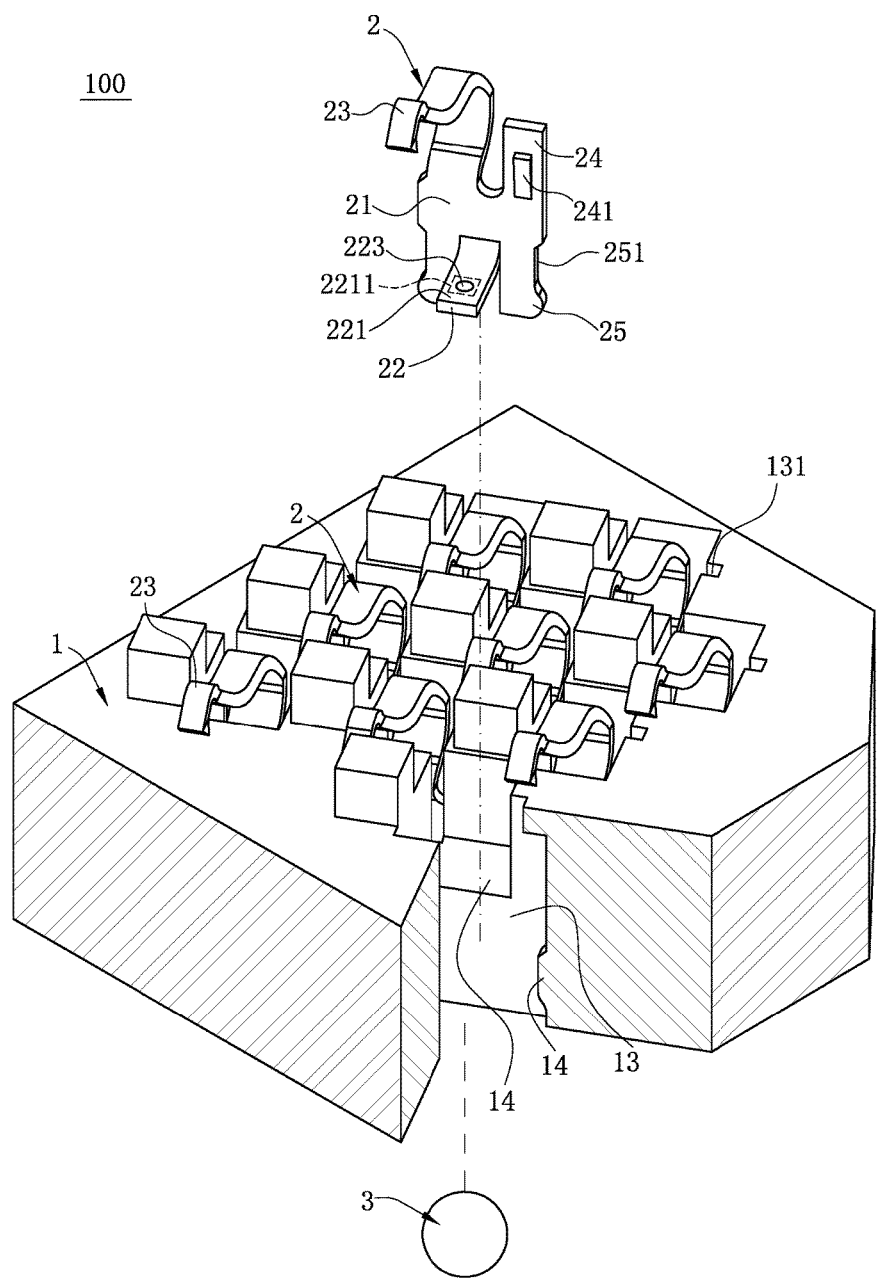
FIG. 7 is a schematic three-dimensional partial exploded view of an electrical connector according to a second embodiment of the present invention.
Figure 8:
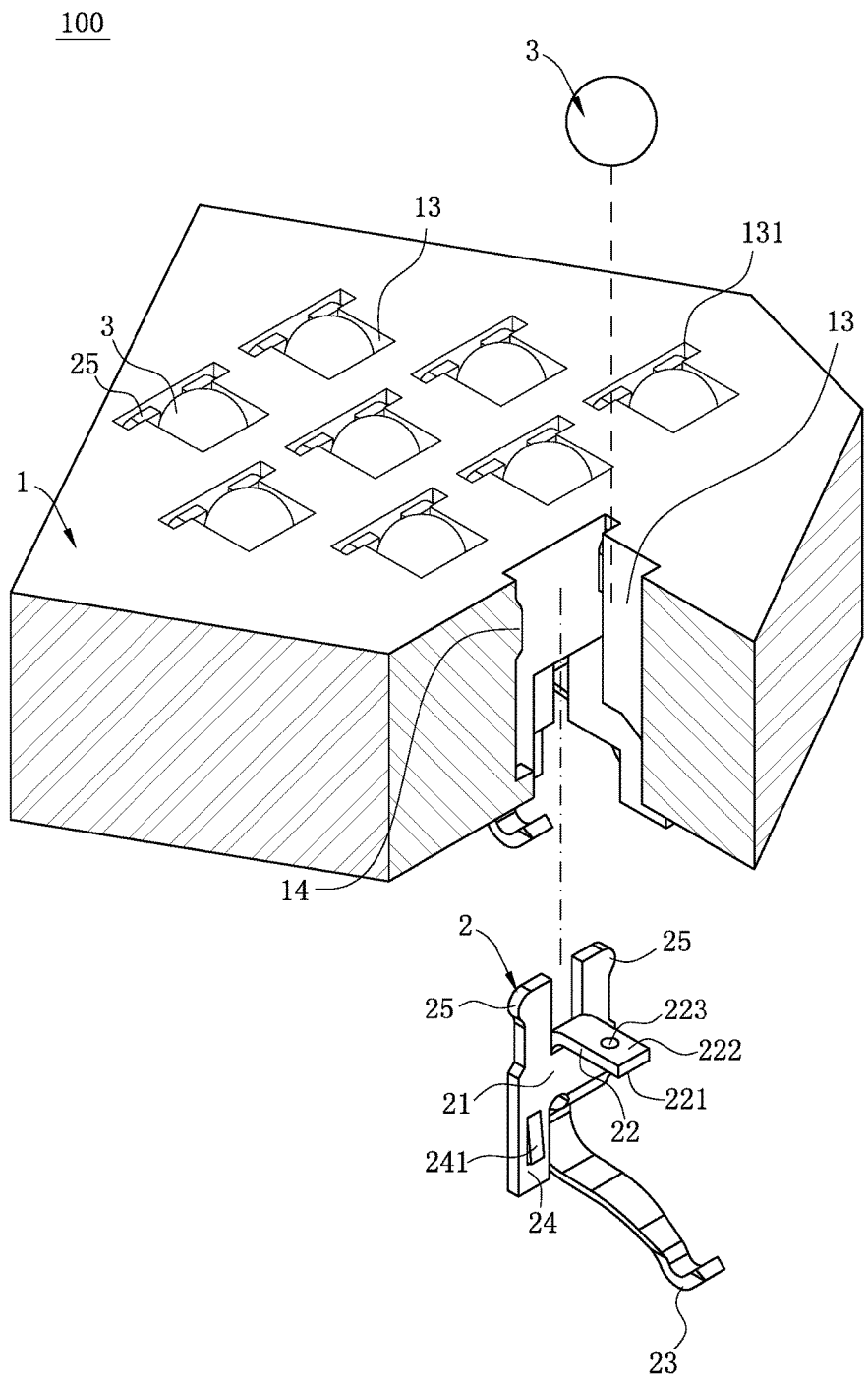
FIG. 8 is a schematic three-dimensional partial exploded view of the electrical connector according to the second embodiment of the present invention viewed from another view angle.
Figure 9:
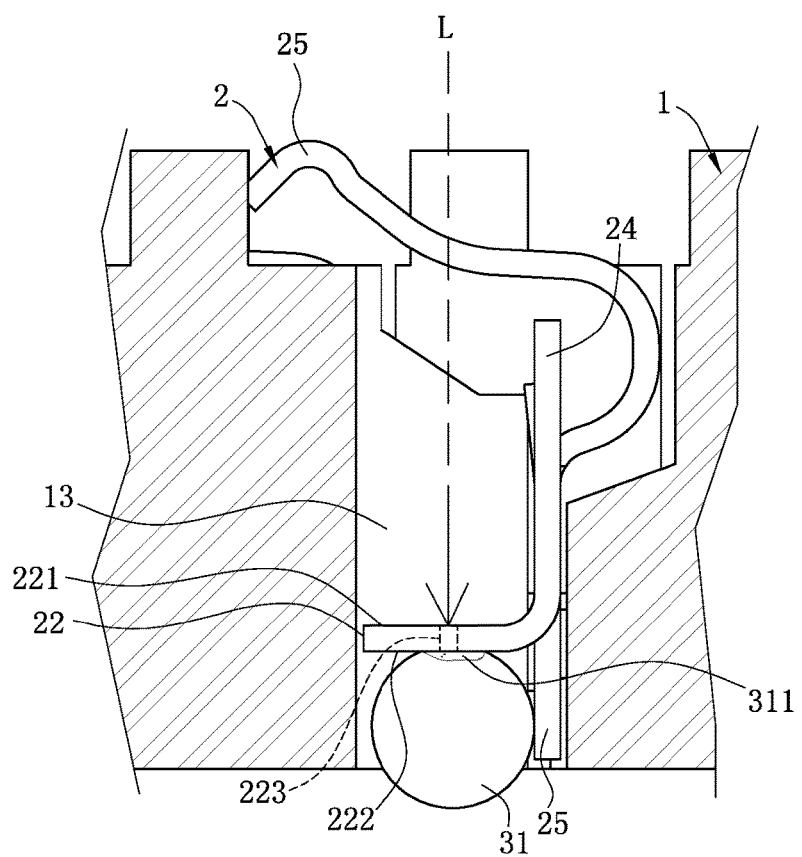
FIG. 9 is a local sectional view of the electrical connector according to the second embodiment of the present invention showing laser soldering.

FIGS. 7-9 show an electrical connector 100 according to a second embodiment of the present invention. The difference between the second embodiment and the first embodiment lies in that: the stopping block 141 is not provided and stopped on the side surface of the solder 3, the solder 3 directly resists against the positioning portion 25, a round through hole 223 is provided to run through the laser irradiation area 2211, the solder 3 urges the through hole 223, and external laser L completely or partially irradiates the solder 3 through the through hole 223 via the receiving hole 13. Other structures are identical to those of the first embodiment and will not be elaborated herein.

In the first and second embodiments, the soldering portion 22 may not bend horizontally, but bends at other angles such as 30°, 45°, 60°, and 75°.

Figure 10:
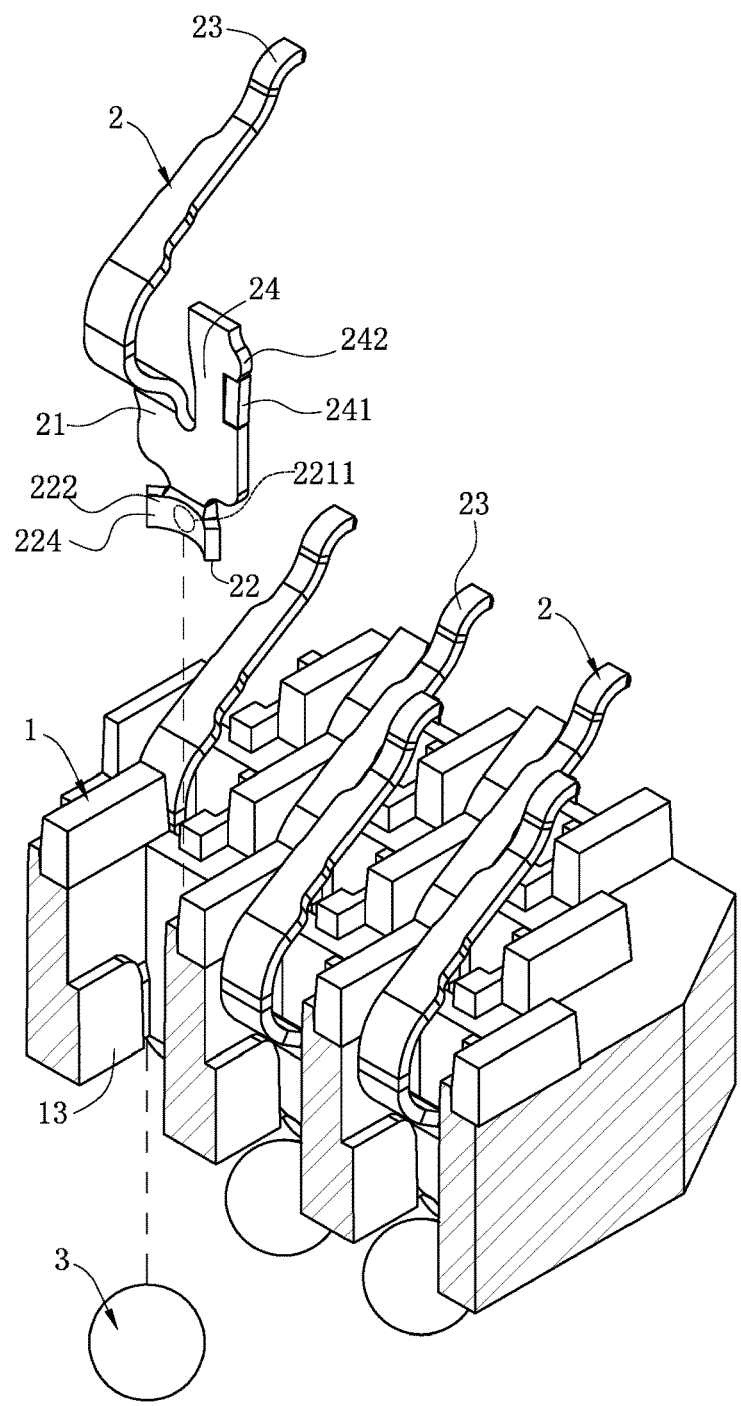
FIG. 10 is a schematic three-dimensional partial exploded view of an electrical connector according to a third embodiment of the present invention.
Figure 11:
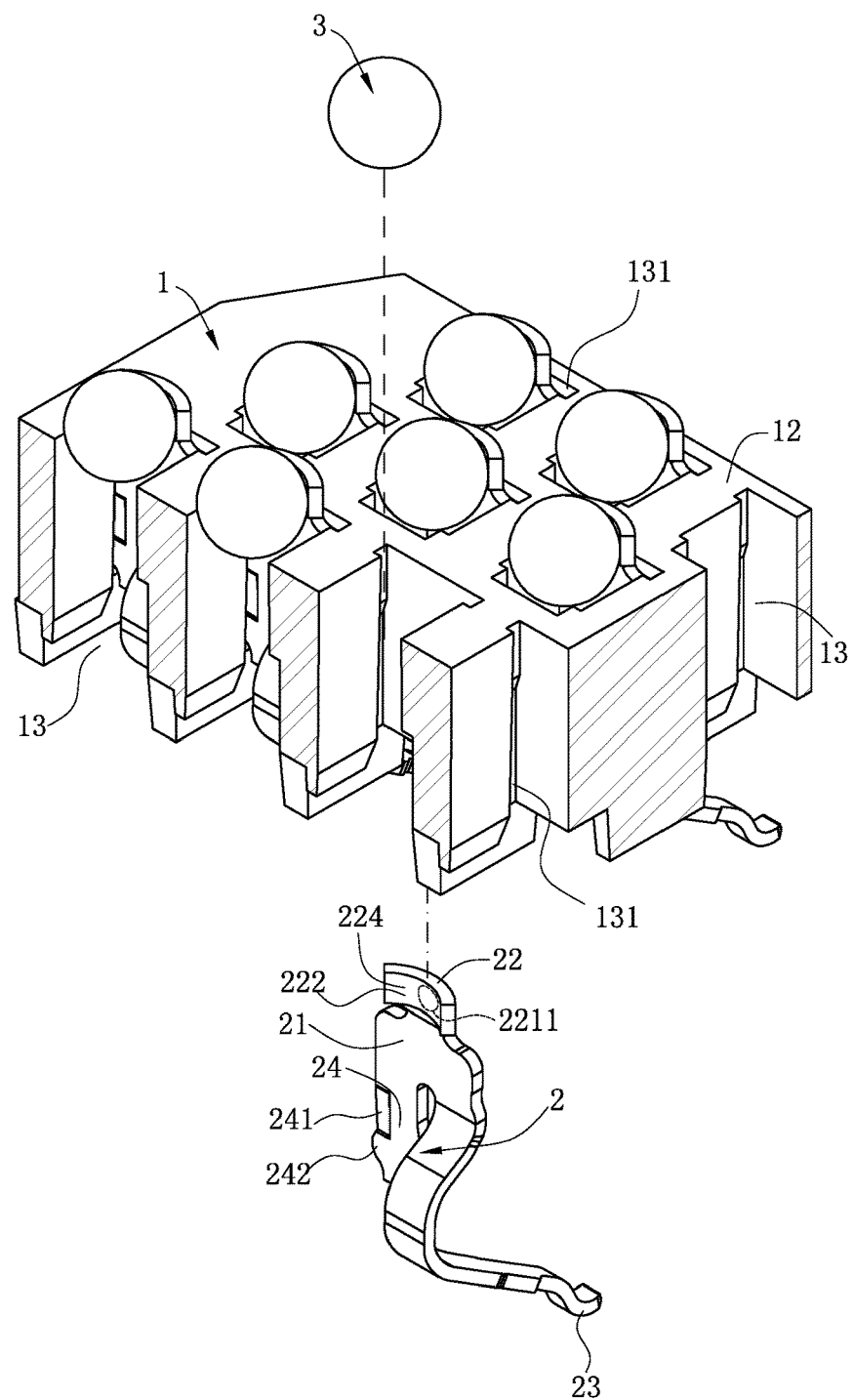
FIG. 11 is a schematic three-dimensional partial exploded view of the electrical connector according to the third embodiment of the present invention viewed from another view angle.
Figure 12:
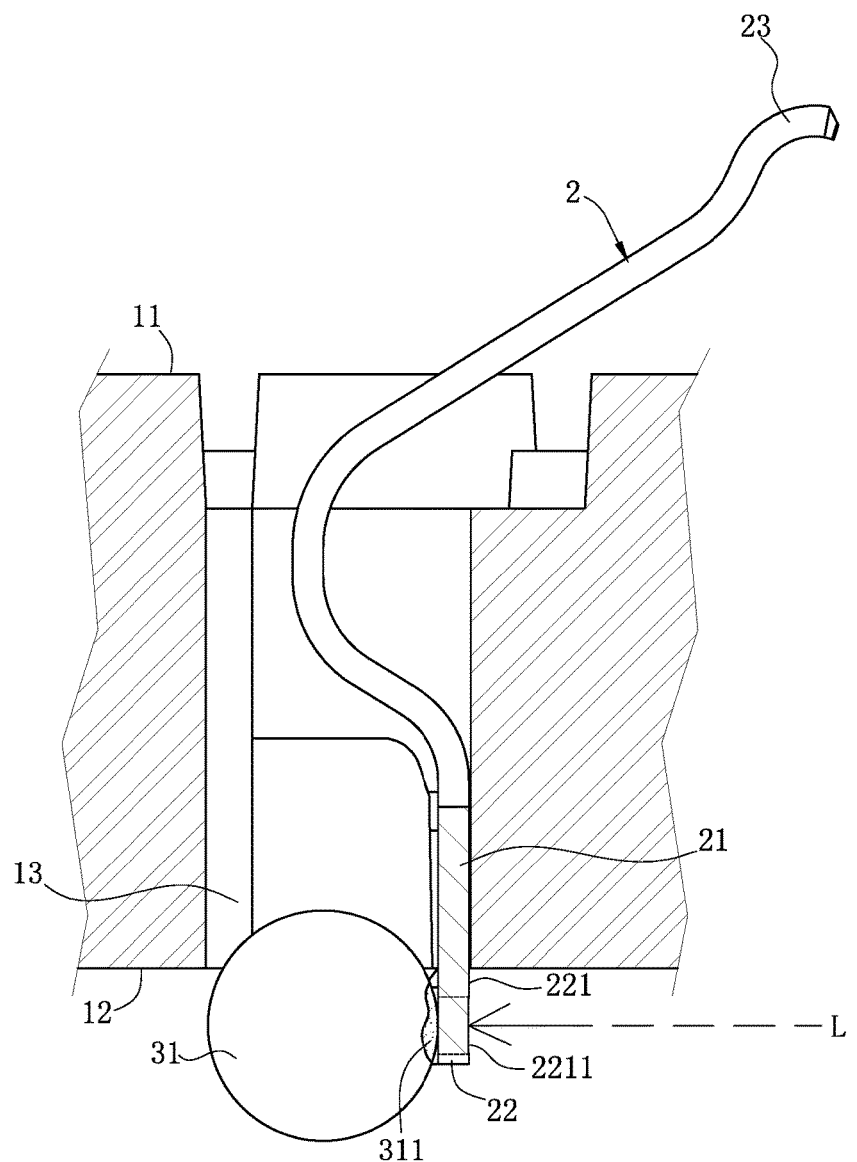
FIG. 12 is a local sectional view of the electrical connector according to the third embodiment of the present invention showing laser soldering.

FIGS. 10-12 show an electrical connector 100 according to a third embodiment of the present invention. The difference between the third embodiment and the first embodiment lies in that: the barb 241 is located at an outer side edge of the strip connecting portion 24, and a fillet 242 protruding, close to a position above the barb 241, from the strip connecting portion 24 is received in the receiving slot 131; the soldering portion 22 is exposed out of the receiving hole 13, the soldering portion 22 has a holding portion 224 which extends to two sides and holds the solder 3, the solder 3 is spherical, and the soldering portion 22 bends in a circular arc shape adaptive to the solder 3; and the insulating body 1 is provided with a stopping portion 14 stopped on the side surface of the solder 3, the stopping portion 14 is located at two corner positions on a side surface, opposite to the base 21, of the receiving hole 13, external laser L directly irradiates the laser irradiation area 2211, energy is conducted to the solder 3, and the solder 3 is partially melted and is further soldered and fixed to the second surface 222. Other structures are identical to those of the first embodiment and will not be elaborated herein.

Figure 13:
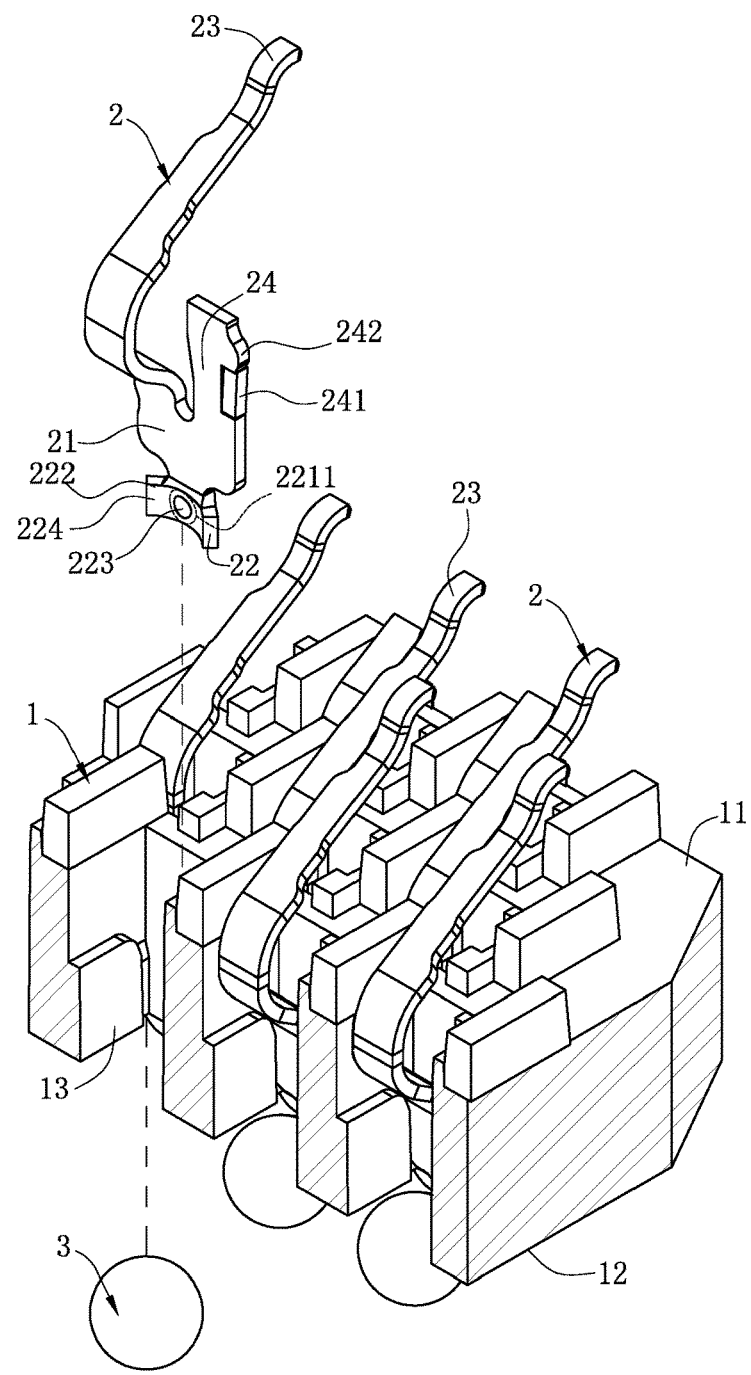
FIG. 13 is a schematic three-dimensional partial exploded view of an electrical connector according to a fourth embodiment of the present invention.
Figure 14:
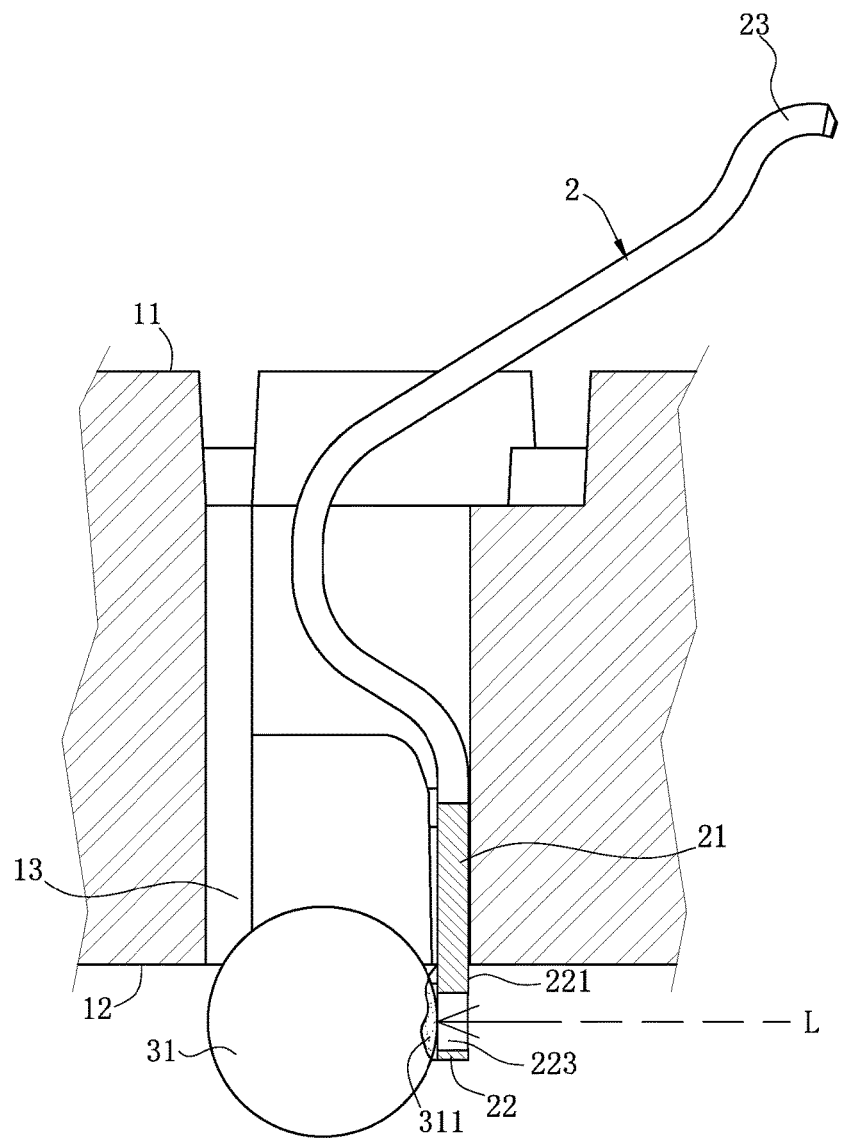
FIG. 14 is a local sectional view of the electrical connector according to the fourth embodiment of the present invention showing laser soldering.

FIGS. 13 and 14 show an electrical connector 100 according to a fourth embodiment of the present invention. The difference between the fourth embodiment and the third embodiment lies in that: a round through hole 223 is provided to run through the laser irradiation area 2211, the solder 3 urges the through hole 223, and external laser L completely or partially irradiates the solder 3 through the through hole 223 via the receiving hole 2211. Other structures are identical to those of the third embodiment and will not be elaborated herein.

Figure 15:
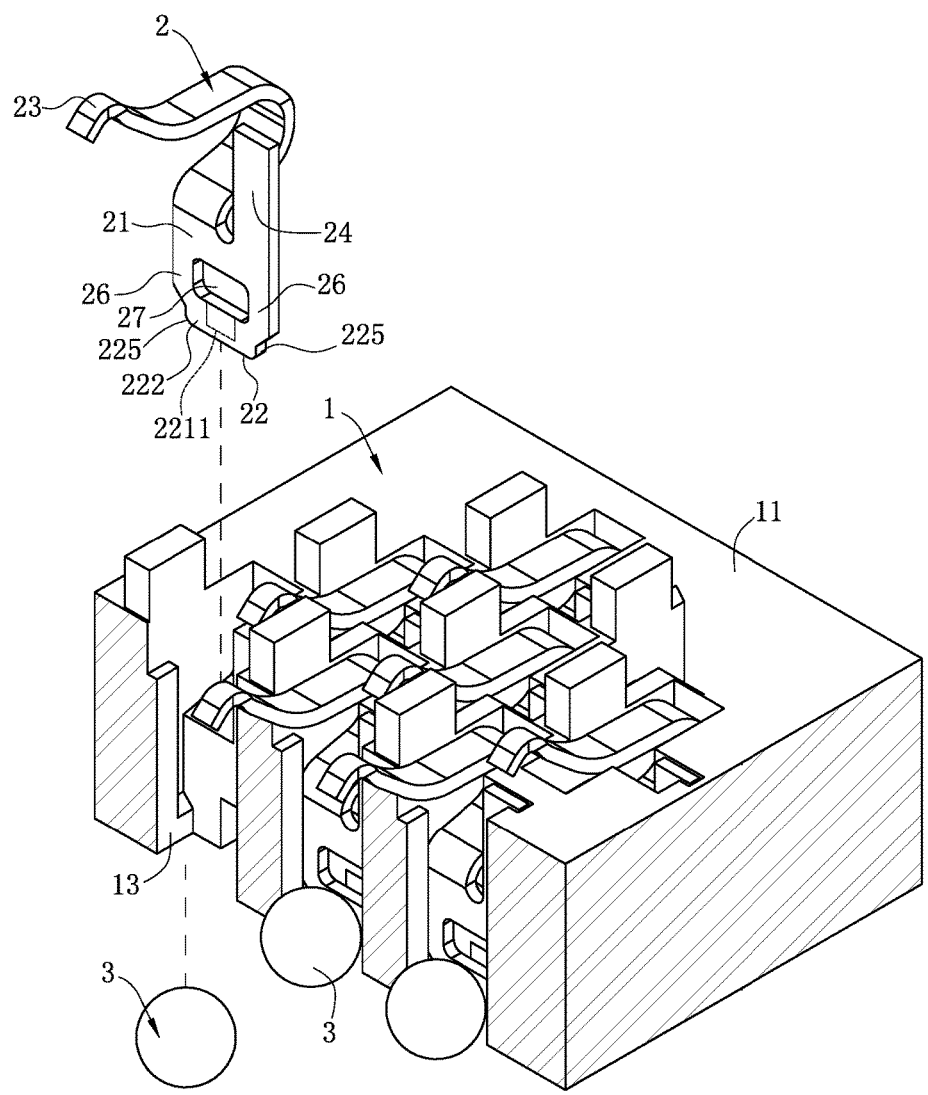
FIG. 15 is a schematic three-dimensional partial exploded view of an electrical connector according to a fifth embodiment of the present invention.
Figure 16:
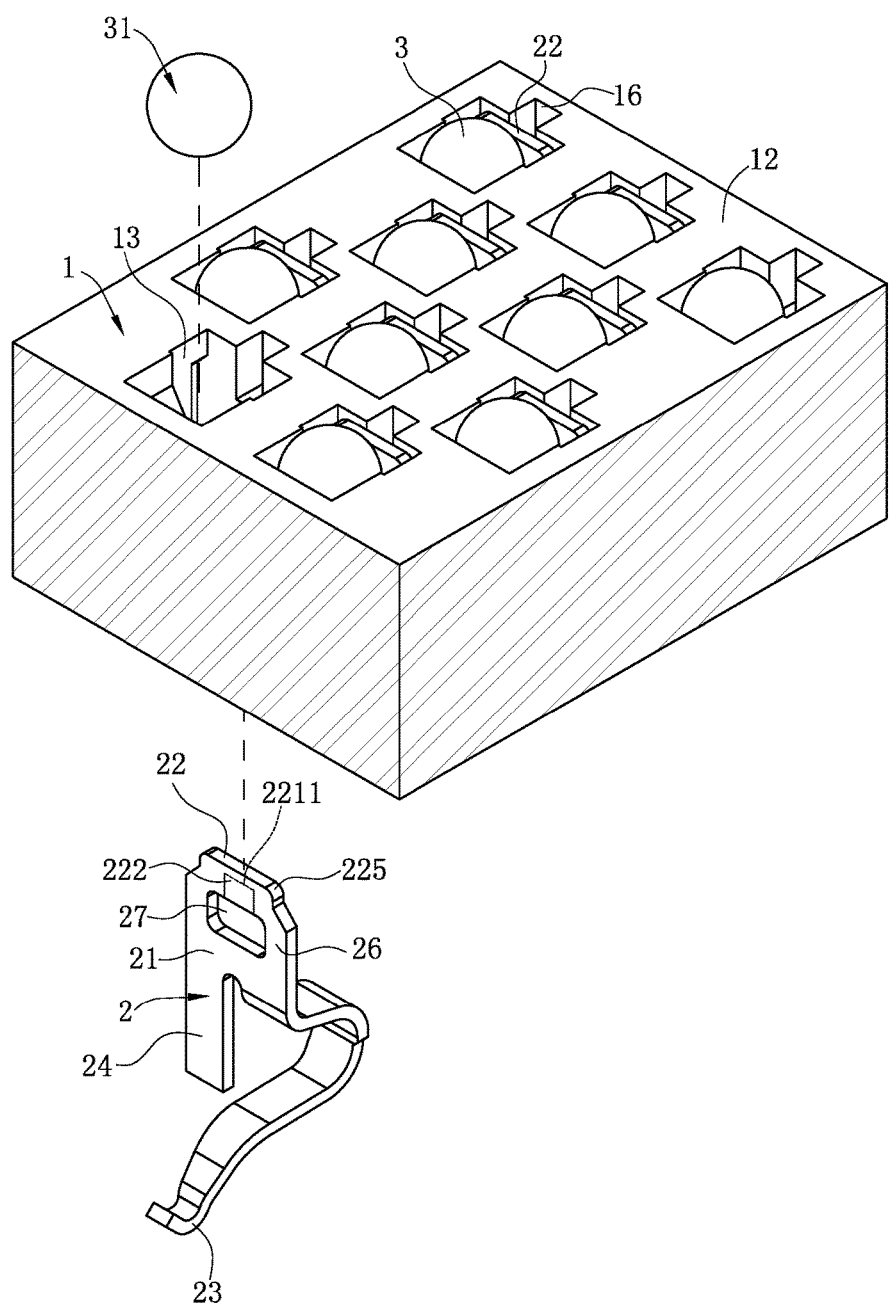
FIG. 16 is a schematic three-dimensional partial exploded view of the electrical connector according to the fifth embodiment of the present invention viewed from another view angle.
Figure 17:
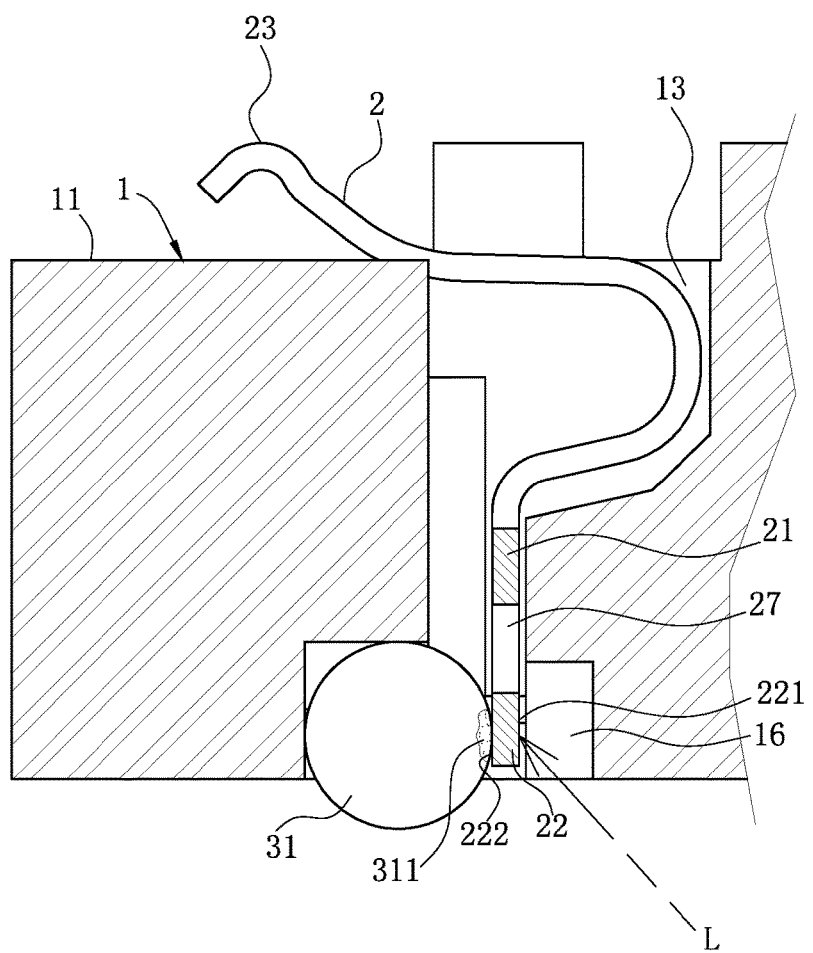
FIG. 17 is a local sectional view of the electrical connector according to the fifth embodiment of the present invention showing laser soldering.

FIGS. 15-17 show an electrical connector 100 according to a fifth embodiment of the present invention. The difference between the fifth embodiment and the first embodiment lies in that: two extending arms 26 extending down vertically are provided between the base 21 and the soldering portion 22; the base 21 and the soldering portion 22 are located on the same plane, the extending arms 26, the base 21 and the soldering portion 22 co-encircling a through slot 27; a chamfer 225 is recessed in each of two sides of the lower edge of the soldering portion 22, and multiple stopping portions 14 are disposed in the receiving holes 13 of the insulating body 1 and stopped below the chamfer 225 and above the solder 3 respectively; and a laser incidence slot 16 is provided at a part, close to the laser irradiation area 2211, of the bottom of the insulating body 1, the laser incidence slot 16 communicates with the receiving hole 13, and external laser L irradiates the laser irradiation area 2211 via the laser incidence slot 16. Other structures are identical to those of the first embodiment and will not be elaborated herein.

Figure 18:
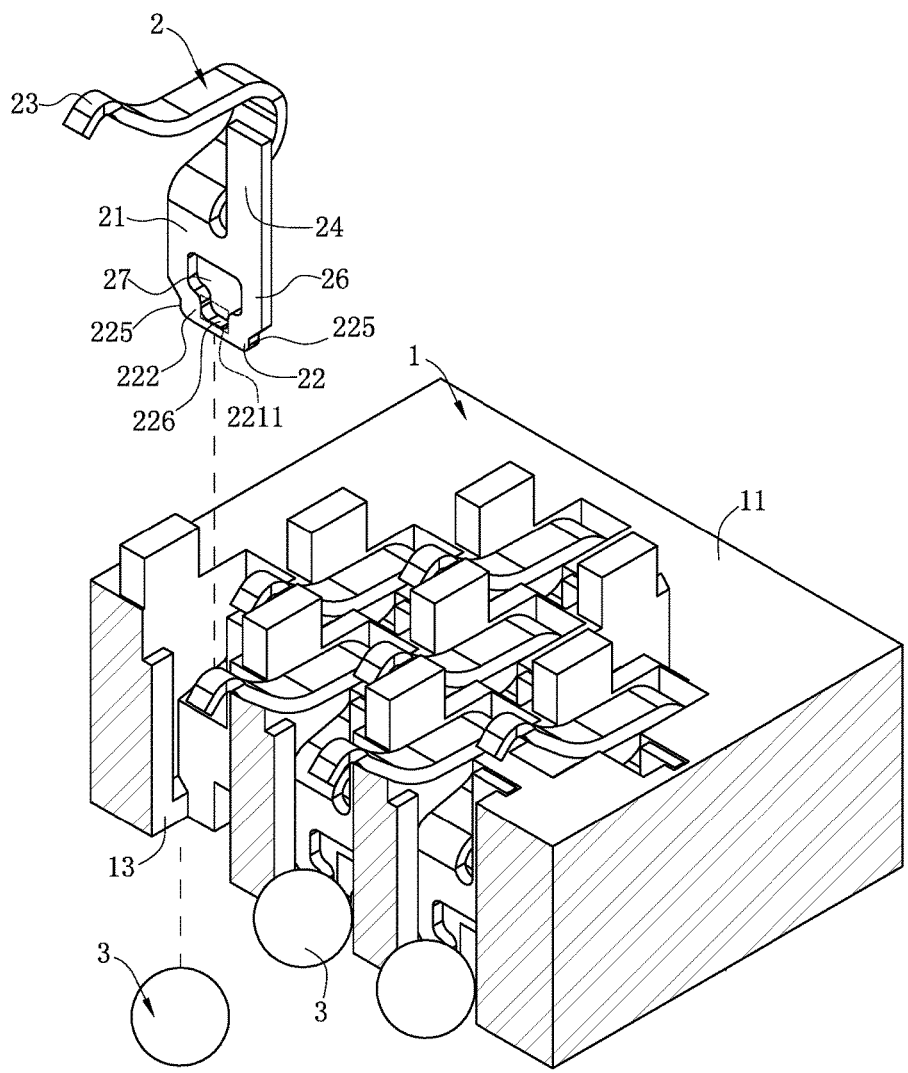
FIG. 18 is a schematic three-dimensional partial exploded view of an electrical connector according to a sixth embodiment of the present invention.
Figure 19:
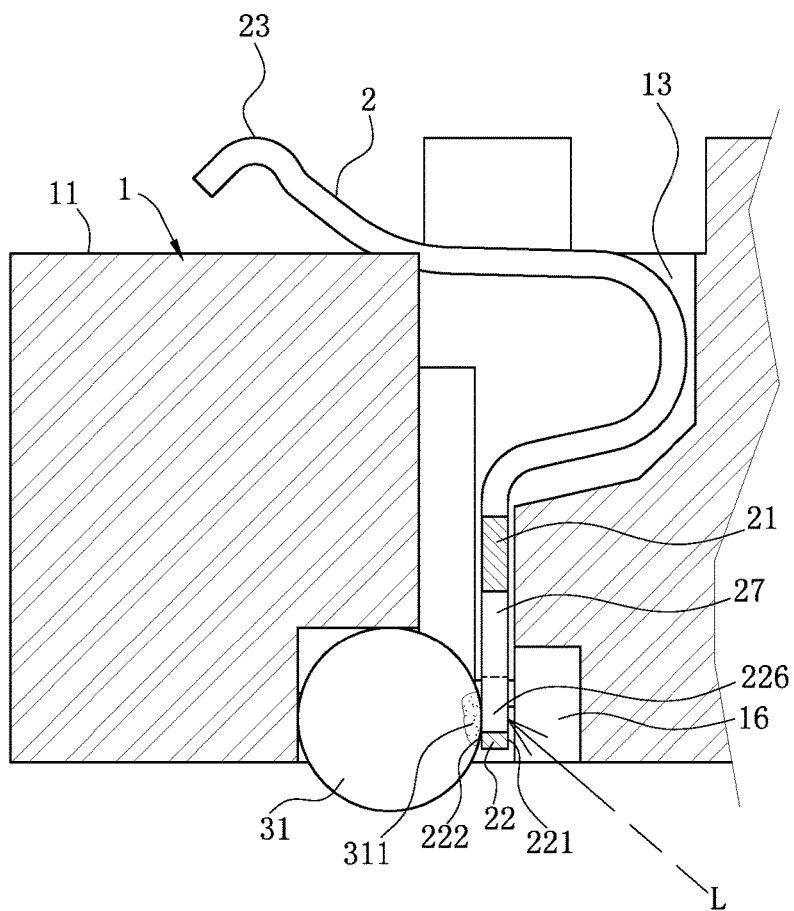
FIG. 19 is a local sectional view of the electrical connector according to the sixth embodiment of the present invention showing laser soldering.

FIGS. 18 and 19 show an electrical connector 100 according to a sixth embodiment of the present invention. The difference between the sixth embodiment and the fifth embodiment lies in that: the through slot 27 protrudes down into the soldering portion 22, so as to form a recessed portion 226 in the center of the upper part of the soldering portion 22, the solder 3 urges the recessed portion 226, and external laser L completely or partially irradiates the solder 3 through the recessed portion 226 via the laser incidence slot 16. Other structures are identical to those of the fifth embodiment and will not be elaborated herein.

Figure 20:
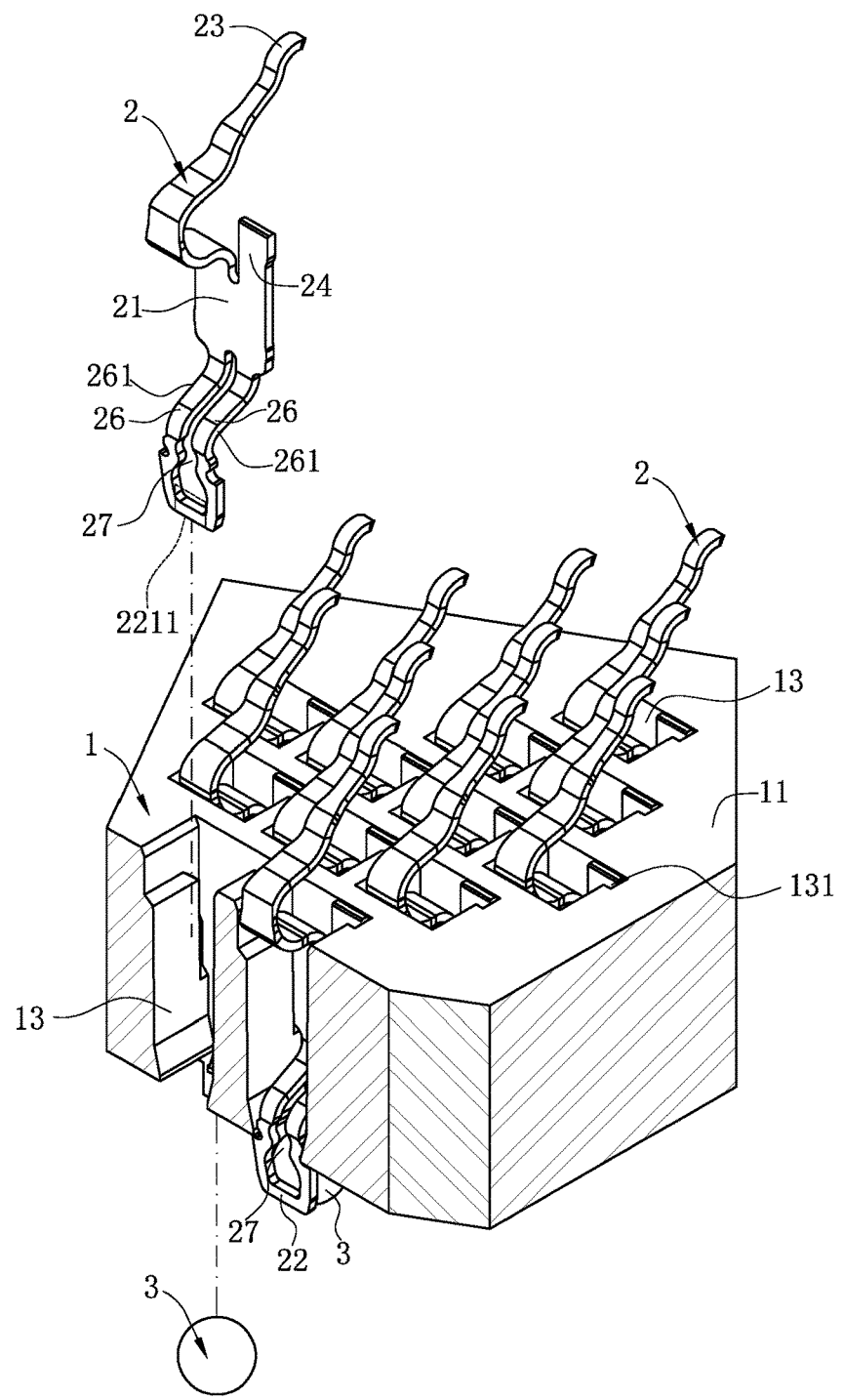
FIG. 20 is a schematic three-dimensional partial exploded view of an electrical connector according to a seventh embodiment of the present invention.
Figure 21:
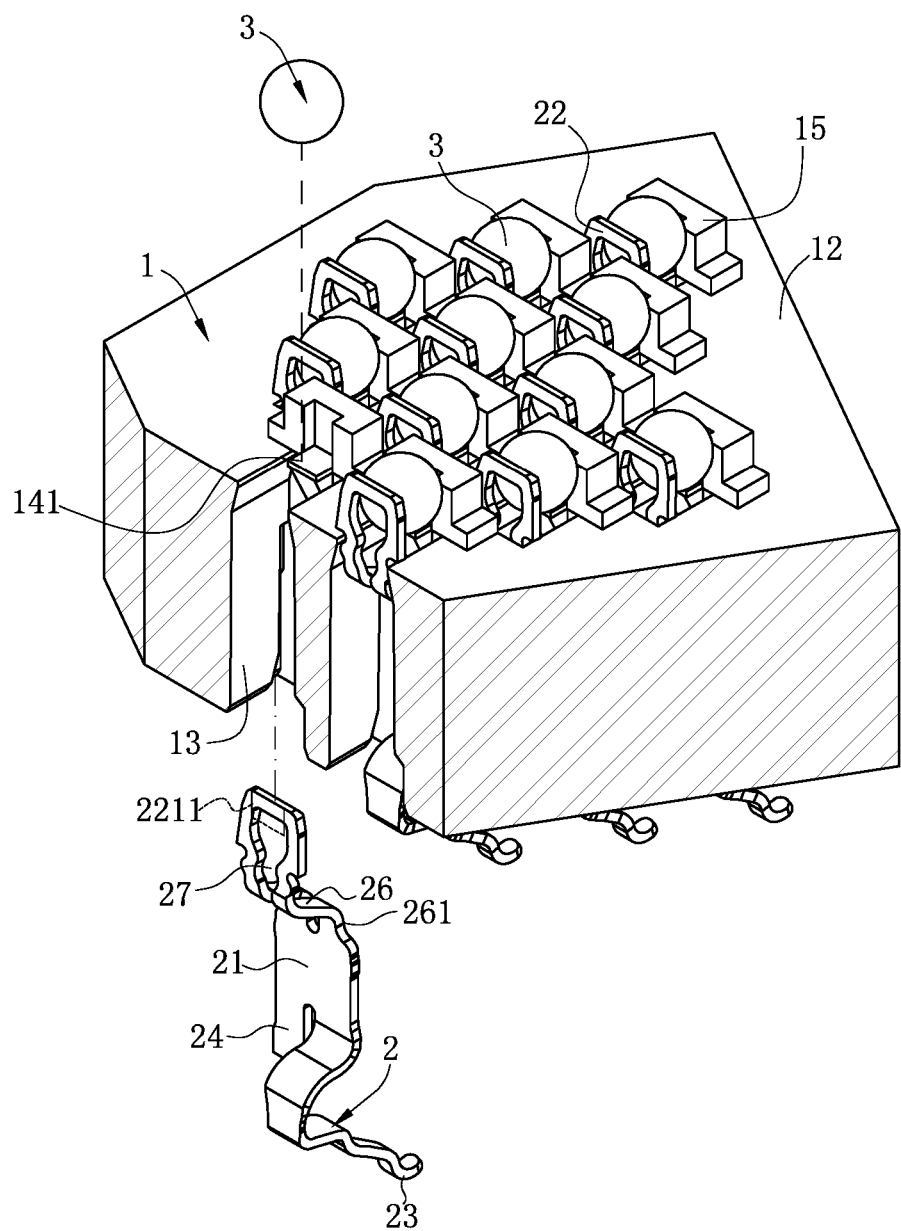
FIG. 21 is a schematic three-dimensional partial exploded view of the electrical connector according to the seventh embodiment of the present invention viewed from another view angle.
Figure 22:
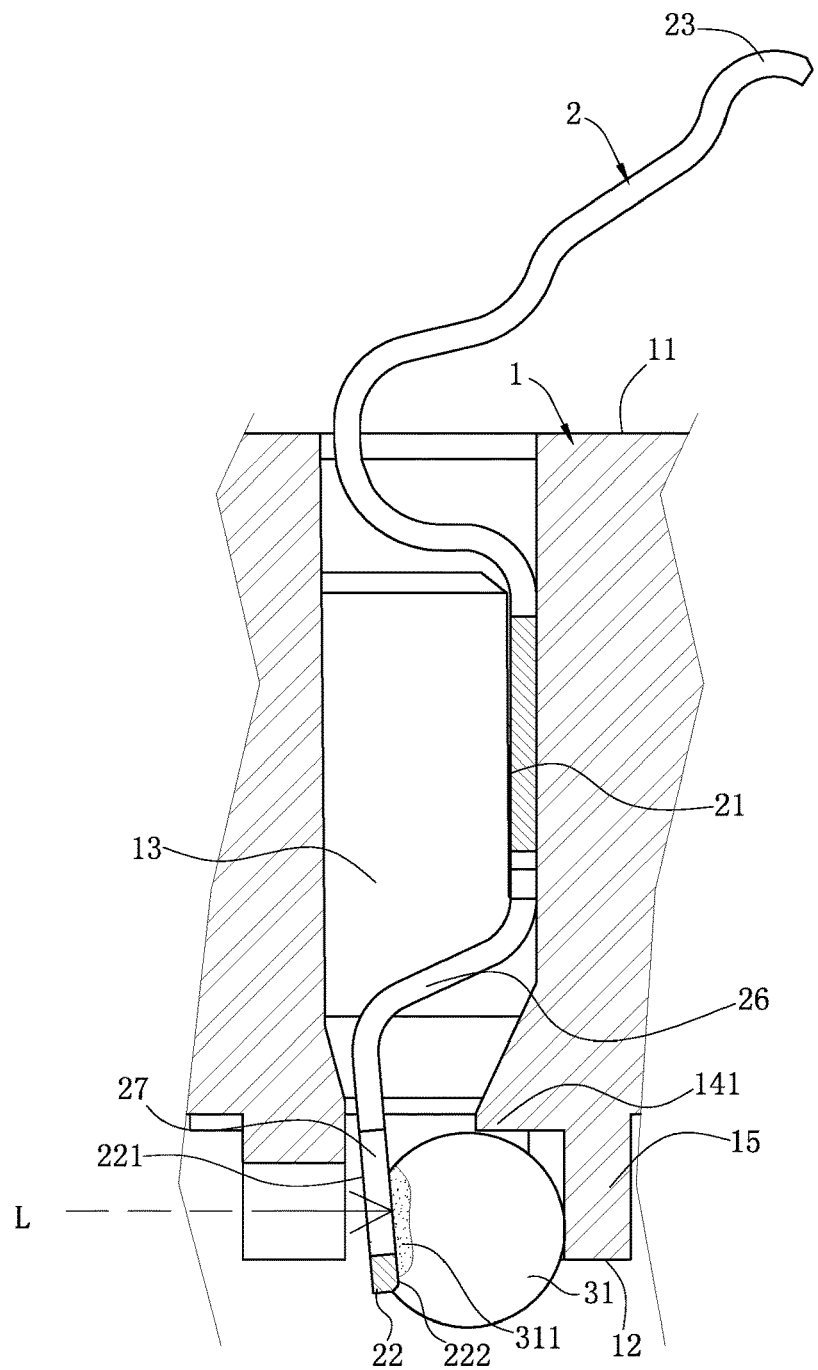
FIG. 22 is a local sectional view of the electrical connector according to the seventh embodiment of the present invention showing laser soldering.

FIGS. 20-22 show an electrical connector 100 according to a seventh embodiment of the present invention. The difference between the seventh embodiment and the fifth embodiment lies in that: the extending arm 26 bends and extends down, the base 21 and the soldering portion 22 are close to planes where two opposite sides of the receiving hole 13 are located, respectively, and the soldering portion 22 is exposed out of the receiving hole 13; a notch 261 is provided in an outer side edge of the extending arm 26, a stopping portion 14 is disposed in the receiving hole 13 of the insulating body 1 and stopped in the notch 261, and a lower edge of the notch 261 is fastened on the bottom surface 12 in a hook shape; a stopping block 141 is disposed at the lower part of the receiving hole 13 of the insulating body 1 and stopped above the solder 3, the stopping block 141 and the base 21 are located at the same side of the receiving hole 13, the solder 3 urges the through slot 27, and the soldering portion 22, the extending arm 26 and the stopping block 141 co-retain the solder 3; and external laser L completely or partially irradiates the solder 3 through the through hole 223 via the through slot 27, energy is conducted to the solder 3, and the solder 3 is partially melted and is further soldered and fixed to the second surface 222. Other structures are identical to those of the fifth embodiment and will not be elaborated herein.

Figure 23:
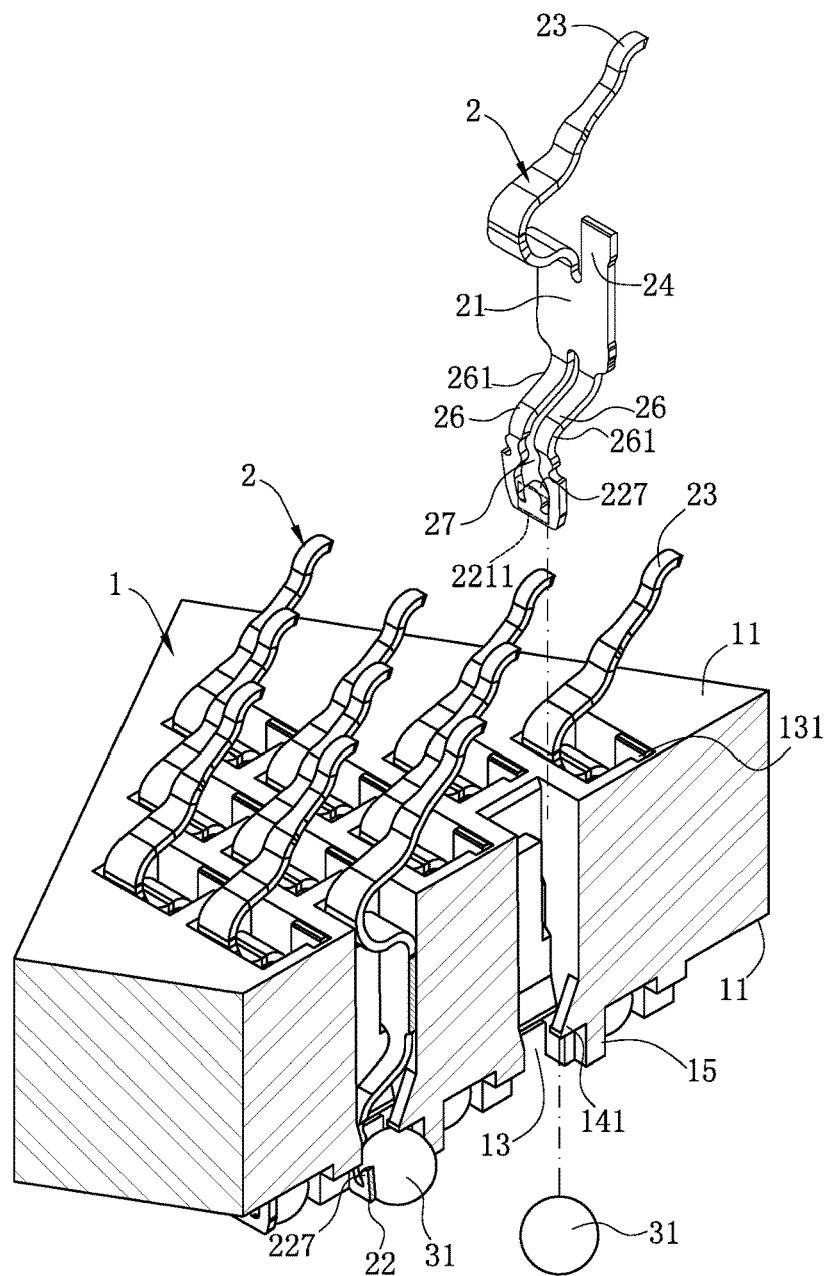
FIG. 23 is a schematic three-dimensional partial exploded view of an electrical connector according to an eighth embodiment of the present invention.
Figure 24:
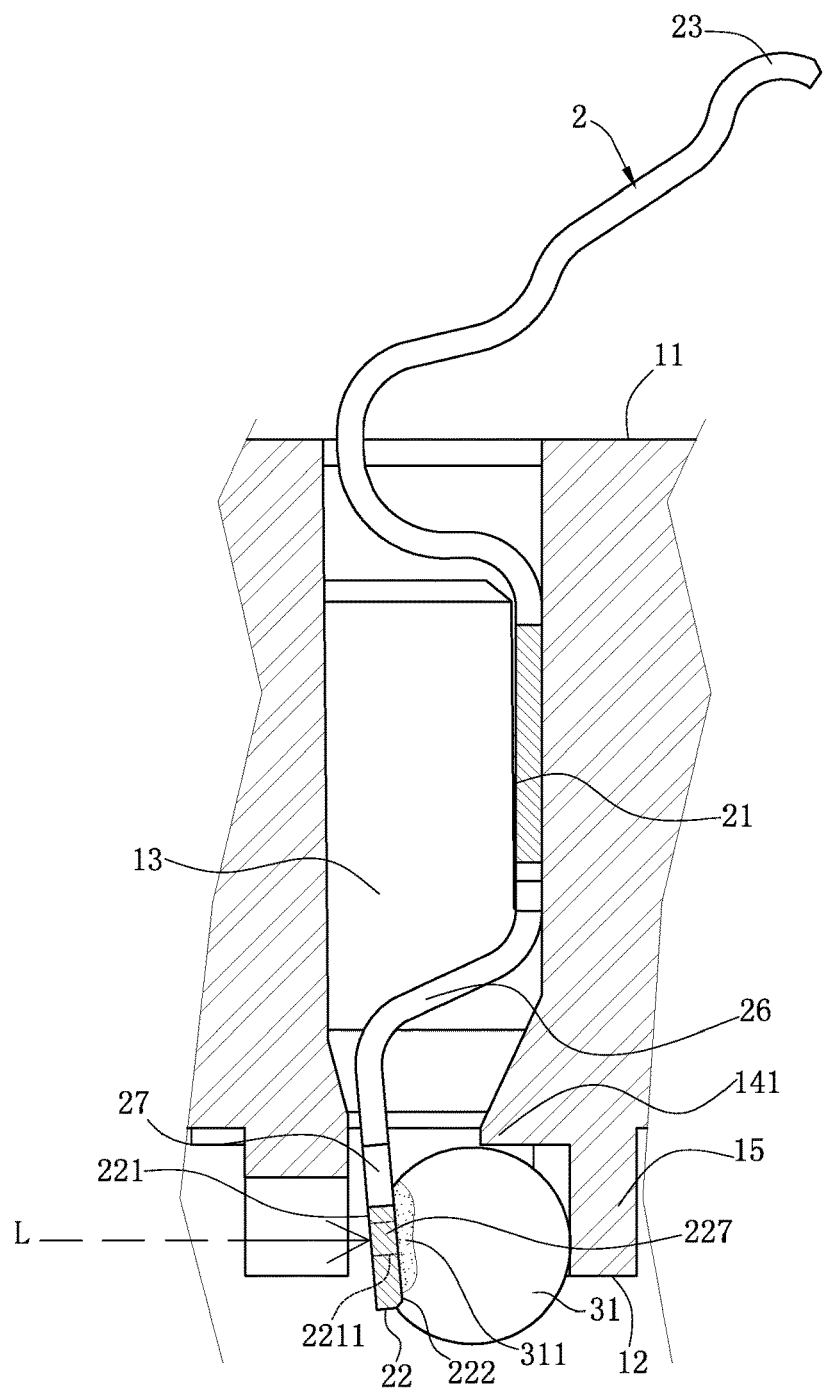
FIG. 24 is a local sectional view of the electrical connector according to the eighth embodiment of the present invention showing laser soldering.

FIGS. 23 and 23 show an electrical connector 100 according to an eighth embodiment of the present invention. The difference between the eighth embodiment and the seventh embodiment lies in that: the soldering portion 22 has a protruding portion 227 which protrudes into the through slot 27, the laser irradiation area 2211 is located on the protruding portion 227, the solder 3 urges the protruding portion 227, the soldering portion 22, the stopping block 141 and the protruding block 15 co-retain the solder 3, and external laser L directly irradiates the laser irradiation area 2211. Other structures are identical to those of the seventh embodiment and will not be elaborated herein.

In the above first, second, fifth, sixth, seventh and eighth embodiments, the insulating body 1 matches with the terminal 2 to be capable of pre-mounting the solder 3, so the solder 3 will not disengage in a laser soldering process. Further, the electrical connector 100 may be inverted for laser soldering. On the basis of the above embodiments, some simple changes may be made. For example, the terminal 2 and the solder 3 may be assembled in the insulating body 1 after being soldered. That is, laser directly irradiates the laser irradiation area 2211, the solder 3 is partially melted by heat and soldered with the soldering portion 22, and the soldered terminal 2 and the solder 3 are co-assembled in the receiving hole 13. This process is the same as a process in which the terminal 2 is assembled in the insulating body 1 and then soldered with the solder 3 in the third embodiment and the fourth embodiment, the solder 3 needs to be fixed by means of a fixture (not shown) and then to be soldered with the soldering portion 22, and the terminal 2 and the insulating body 1 may be further adjusted structurally. For example, the insulating body 1 is not provided with the stopping portion 14 for stopping the solder 3. The soldering portion 22 in the first embodiment and the second embodiment may not bend. The soldering portion 22 in the third embodiment and the fourth embodiment may be received in the receiving hole 13, thereby reducing the height of the terminal 2 so as to reduce the height of the entire connector. The laser incidence slot 16 may be omitted in the fifth embodiment and the sixth embodiment. The soldering portion 22 may be received in the receiving hole 13 likewise in the seventh embodiment and the eighth embodiment, and the stopping block 141 and the protruding block 15 may also be omitted, thereby simplifying the process, reducing the height of the entire electrical connector 100, and so on.

In the above embodiment, the solder 3 is a solder ball 31, and the size of a melted part 311 of the solder ball 31 is ⅕ of the total size of the entire solder ball 31. In other embodiments, the size ratio of the melted part 311 of the solder ball 3 to the entire solder ball 31 may be other ratios instead of ⅖, and the solder 3 may be not the solder ball 31.

In summary, the electrical connector 100 according to certain embodiments of the present invention, among other things, has the following beneficial advantages:

The laser irradiation area 2211 is heated by means of external laser L. Since the range of the laser irradiation area 2211 can be artificially regulated and controlled according to the precision of a laser soldering instrument, it is ensured that a laser beam L irradiates the laser irradiation area 2211. The terminal 2 is made of a common material namely copper alloy, the melting point of the copper alloy is 1083.4° C. and is much higher than the melting point (231.9° C.) of a common soldering material namely tin. When the temperature of the laser irradiation area 2211 reaches about 300° C., the part, urging the second surface 222, of the solder ball 31 may reach the melting point to be melted, such that the solder ball 31 and the soldering portion 22 are soldered. Thus, the success rate of soldering of the soldering portion 22 and the solder ball 31 is ensured, missing solder is avoided, and the solder ball 31 can be partially melted while other parts keep in a circular arc shape to make the shape and the size consistent. When the electrical connector 100 is soldered to the circuit board PCB, a contact surface between the solder ball 31 and the circuit board PCB is in the same plane, and the soldering quality is ensured, such that the electrical connector 100 has excellent electrical properties. Compared with the related art in which the solder ball 31 is completely melted and then soldered with the soldering portion 22, the present invention saves more energy due to the fact that the solder ball 31 is partially melted.

The laser irradiation area 2211 is provided with a through hole 223. Due to the capillary action, the through hole 223 is full of melted solder liquid, or even the melted solder liquid is solidified on the first surface 221, thereby enhancing the stability of soldering. More importantly, the through hole 223 may limit the scope of irradiation of the laser beam L, such that external laser L may directly irradiate the solder ball 31 via the through hole 223, thereby improving the precision of soldering and the utilization rate of energy, saving time needed for heating the solder ball 31, improving the soldering efficiency, shortening the product period, and reducing the product cost while ensuring that the electrical connector 100 product has excellent electrical properties.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
    an insulating body having a top surface and a bottom surface, a plurality of receiving holes running through the insulating body; and
    a plurality of terminals respectively received in the receiving holes,
    wherein each terminal has a base and a soldering portion extending from a lower part of the base, the soldering portion has a first surface and a second surface arranged at two opposite sides thereof, the first surface includes a laser irradiation area, and a solder ball is provided to urge a position, opposite to the laser irradiation area, of the second surface; and
    wherein by heating the laser irradiation area using an external laser before the electrical connector is mounted on a circuit board, the solder ball in contact with the second surface is partially melted and is further soldered and fixed to the second surface, and then the electrical connector is mounted on the circuit board such that the partially melted solder ball is soldered to the circuit board.

2. The electrical connector of claim 1, wherein an elastic arm is formed by bending and extending up from the base and comes into electrical contact with a chip module, a horizontal projection of the elastic arm is partially overlapped or not overlapped with a horizontal projection of the laser irradiation area, and the horizontal projection of the laser irradiation area is exposed in the receiving hole.

3. The electrical connector of claim 1, wherein an elastic arm is formed by bending and extending up from one side of an upper edge of the base and comes into electrical contact with a chip module, a strip connecting portion extends up vertically from the other side of the upper edge of the base and is used for connecting a strip, the strip connecting portion is received in a receiving slot correspondingly provided in the insulating body, the strip connecting portion is torn to form a barb, and the barb extends from the upper edge of the base to the center of the strip connecting portion.

4. The electrical connector of claim 1, wherein an elastic arm is formed by bending and extending up from one side of an upper edge of the base and comes into electrical contact with a chip module, a strip connecting portion extends up vertically from the other side of the upper edge of the base and is used for connecting a strip, the strip connecting portion is received in a receiving slot correspondingly provided in the insulating body, an outer side edge of the strip connecting portion is torn to form a barb, and a fillet protruding, close to a position above the barb and from the strip connecting portion, is fastened in the receiving slot.

5. The electrical connector of claim 1, wherein the soldering portion bends in a horizontal direction, and the first surface faces the top surface.

6. The electrical connector of claim 5, wherein a positioning portion extends down vertically from the base, and engages with the receiving hole to position the terminal, and the height of a lower edge of the positioning portion is between the second surface and a lowest point of the solder ball.

7. The electrical connector of claim 6, wherein there are two positioning portions located at two sides of the soldering portion respectively, a pair of grooves is recessed in the outer sides of the two positioning portions symmetrically, and stopping portions are disposed in the receiving holes of the insulating body in correspondence to the grooves.

8. The electrical connector of claim 1, wherein a through hole runs through the laser irradiation area, the solder ball urges the through hole, and the external laser completely or partially irradiates the solder ball through the through hole.

9. The electrical connector of claim 8, wherein the through hole is round.

10. The electrical connector of claim 1, wherein at least one extending arm is provided between the base and the soldering portion.

11. The electrical connector of claim 10, wherein there are two extending arms, the extending arms, the base and the soldering portion co-encircling a through slot.

12. The electrical connector of claim 11, wherein the extending arm bends and extends down, the base and the soldering portion are close to planes where two opposite sides of the receiving hole are located, respectively, and the soldering portion is exposed out of the receiving hole.

13. The electrical connector of claim 12, wherein the soldering portion comprises a protruding portion which protrudes into the through slot, and the solder urges the protruding portion.

14. The electrical connector of claim 12, wherein a notch is provided in an outer side edge of the extending arm, a stopping portion is disposed in the receiving hole of the insulating body and stopped in the notch, and a lower edge of the notch is fastened on the bottom surface in a hook shape.

15. The electrical connector of claim 12, wherein a stopping block is disposed at the lower part of the receiving hole of the insulating body and stopped above the solder, the stopping block and the base are located at the same side of the receiving hole, a protruding block protrudes from the bottom surface of the insulating body, and the protruding block is located at the edge of the receiving hole and opposite to the soldering portion.

16. The electrical connector of claim 15, wherein the solder urges the through slot, and the soldering portion, the extending arm, the protruding block and the stopping block together retain the solder.

17. The electrical connector of claim 11, wherein the extending arms extend down vertically, such that the base and the soldering portion are located in the same plane.

18. The electrical connector of claim 17, wherein a chamfer is recessed in each of two sides of the lower edge of the soldering portion, and a stopping portion is disposed in the receiving hole of the insulating body and stopped below the chamfer.

19. The electrical connector of claim 17, wherein the through slot protrudes down into the soldering portion, such that a recessed portion is formed in the center of the upper part of the soldering portion, and the solder urges the recessed portion.

20. The electrical connector of claim 1, wherein a laser incidence slot is provided at a part, close to the laser irradiation area, of the bottom of the insulating body, the laser incidence slot communicates with the receiving hole, and external laser irradiates the laser irradiation area via the laser incidence slot.

21. An electrical connector, comprising:
an insulating body having a top surface and a bottom surface, a plurality of receiving holes running through the insulating body; and
a plurality of terminals respectively received in the receiving holes,
wherein each terminal has a base and a soldering portion extending from a lower part of the base, the soldering portion has an upper surface and a lower surface, the upper surface includes a laser irradiation area, and a solder is provided to urge a position of the lower surface opposite to the laser irradiation area;
wherein an elastic arm is formed by bending and extending up from the base and comes into electrical contact with a chip module, a horizontal projection of the elastic arm is partially not overlapped with a horizontal projection of the laser irradiation area, and the horizontal projection of the laser irradiation area is exposed in the receiving hole; and
wherein by inverting the electrical connector and heating the laser irradiation area using an external laser through the receiving hole, the solder in contact with the second surface is partially melted and is further soldered and fixed to the second surface.

22. The electrical connector of claim 21, wherein a positioning portion extends down vertically from the base, and engages with the receiving hole to position the terminal, and the height of a lower edge of the positioning portion is between the second surface and a lowest point of the solder.

23. The electrical connector of claim 22, wherein there are two positioning portions located at two sides of the soldering portion respectively, a pair of grooves is recessed in the outer sides of the two positioning portions symmetrically, and stopping portions are disposed in the receiving holes of the insulating body in correspondence to the grooves.

24. The electrical connector of claim 21, wherein a through hole runs through the laser irradiation area, the solder urges the through hole, and the external laser completely or partially irradiates the solder through the through hole.

\* \* \* \* \*